United States Patent
Somervell et al.

(10) Patent No.: US 9,412,611 B2
(45) Date of Patent: Aug. 9, 2016

(54) USE OF GRAPHO-EPITAXIAL DIRECTED SELF-ASSEMBLY TO PRECISELY CUT LINES

(71) Applicant: Tokyo Electron Limited, Minato-ku, Tokyo (JP)

(72) Inventors: Mark H. Somervell, Austin, TX (US); Benjamen M. Rathsack, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/518,548

(22) Filed: Oct. 20, 2014

(65) Prior Publication Data

US 2015/0108087 A1 Apr. 23, 2015

Related U.S. Application Data

(60) Provisional application No. 61/893,277, filed on Oct. 20, 2013, provisional application No. 61/893,275, filed on Oct. 20, 2013.

(51) Int. Cl.
*H01L 21/302* (2006.01)
*H01L 21/308* (2006.01)
(Continued)

(52) U.S. Cl.
CPC .......... *H01L 21/3081* (2013.01); *G03F 7/0002* (2013.01); *G03F 7/091* (2013.01);
(Continued)

(58) Field of Classification Search
CPC ............. G08F 7/09; G08F 7/094; G08F 7/16; G08F 7/203; H01L 21/31116; H01L 21/31144; H01L 21/31; H01L 21/3081; H01L 21/31056; G03F 7/0002; G03F 7/0005
USPC ......... 438/706, 710, 712, 717, 723, 725, 736; 430/310, 312, 313
See application file for complete search history.

(56) References Cited

U.S. PATENT DOCUMENTS

| 5,344,742 A | 9/1994 | Sinta et al. |
| 5,650,261 A | 7/1997 | Winkle |

(Continued)

FOREIGN PATENT DOCUMENTS

| CN | 101681812 A | 3/2010 |
| DE | 102012105384 A1 | 9/2012 |

(Continued)

OTHER PUBLICATIONS

International Searching Authority, Search Report and Written Opinion issued in corresponding International Application No. PCT/US14/61396, mailed Jan. 21, 2015, 9 pages.
(Continued)

*Primary Examiner* — Lan Vinh
(74) *Attorney, Agent, or Firm* — Wood, Herron & Evans, LLP

(57) ABSTRACT

A method for forming a patterned topography on a substrate is provided. The substrate is initially provided with an exposed plurality of lines formed atop. An embodiment of the method includes aligning and preparing a first directed self-assembly pattern (DSA) pattern immediately overlying the plurality of lines, and transferring the first DSA pattern to form a first set of cuts in the plurality of lines. The embodiment further includes aligning and preparing a second DSA pattern immediately overlying the plurality of lines having the first set of cuts formed therein, and transferring the second DSA pattern to form a second set of cuts in the plurality of lines. The first and second DSA patterns each comprise a block copolymer having a hexagonal close-packed (HCP) morphology and a characteristic dimension $L_o$ that is between 0.9 and 1.1 times the spacing between individual lines of the plurality of lines.

22 Claims, 16 Drawing Sheets

(51) Int. Cl.
G03F 7/42 (2006.01)
H01L 21/027 (2006.01)
G03F 7/00 (2006.01)
G03F 7/09 (2006.01)
H01L 21/033 (2006.01)
H01L 21/3213 (2006.01)

(52) U.S. Cl.
CPC .............. *G03F 7/42* (2013.01); *H01L 21/0273* (2013.01); *H01L 21/0337* (2013.01); *H01L 21/3086* (2013.01); *H01L 21/3088* (2013.01); *H01L 21/32139* (2013.01)

(56) References Cited

U.S. PATENT DOCUMENTS

| | | | |
|---|---|---|---|
| 6,303,477 | B1 | 10/2001 | Ianovitch |
| 6,855,476 | B2 | 2/2005 | Ferreira et al. |
| 7,521,094 | B1 | 4/2009 | Cheng et al. |
| 7,579,278 | B2 | 8/2009 | Sandhu |
| 7,687,220 | B2 | 3/2010 | Yamato et al. |
| 7,723,009 | B2 | 5/2010 | Sandhu et al. |
| 7,754,518 | B2 | 7/2010 | Koelmel et al. |
| 7,923,373 | B2 | 4/2011 | Sandhu |
| 8,039,196 | B2 | 10/2011 | Kim et al. |
| 8,083,953 | B2 | 12/2011 | Millward et al. |
| 8,241,822 | B2 | 8/2012 | Yamato et al. |
| 8,420,304 | B2 | 4/2013 | Inatomi |
| 8,603,867 | B2 | 12/2013 | Kim et al. |
| 8,986,554 | B2 * | 3/2015 | Kim ...................... H01L 21/308 216/17 |
| 9,005,877 | B2 * | 4/2015 | Rathsack .............. G03F 7/0002 430/313 |
| 9,034,197 | B2 * | 5/2015 | Lille ...................... G11B 5/855 216/41 |
| 2002/0192619 | A1 | 12/2002 | Besek |
| 2002/0193619 | A1 | 12/2002 | Crivello et al. |
| 2003/0084925 | A1 | 5/2003 | Nakajima et al. |
| 2005/0056219 | A1 | 3/2005 | Dip et al. |
| 2005/0215713 | A1 | 9/2005 | Hessell et al. |
| 2006/0123658 | A1 | 6/2006 | Izumi |
| 2006/0251989 | A1 | 11/2006 | Breyta et al. |
| 2007/0037412 | A1 | 2/2007 | Dip et al. |
| 2007/0224823 | A1 | 9/2007 | Sandhu |
| 2007/0237697 | A1 | 10/2007 | Clark |
| 2007/0238028 | A1 | 10/2007 | Inatomi |
| 2008/0032490 | A1 * | 2/2008 | Tuominen ............. C30B 29/605 438/466 |
| 2008/0193658 | A1 | 8/2008 | Millward |
| 2008/0311402 | A1 | 12/2008 | Jung et al. |
| 2008/0318005 | A1 | 12/2008 | Millward |
| 2009/0081827 | A1 | 3/2009 | Yang et al. |
| 2009/0087664 | A1 | 4/2009 | Nealey et al. |
| 2009/0181171 | A1 | 7/2009 | Cheng et al. |
| 2009/0200646 | A1 | 8/2009 | Millward et al. |
| 2009/0236309 | A1 | 9/2009 | Millward et al. |
| 2009/0291398 | A1 | 11/2009 | Horiuchi |
| 2010/0055621 | A1 | 3/2010 | Hatakeyama et al. |
| 2010/0178615 | A1 | 7/2010 | Colburn et al. |
| 2010/0227276 | A1 | 9/2010 | Mizuno |
| 2010/0279062 | A1 | 11/2010 | Millward et al. |
| 2011/0033786 | A1 | 2/2011 | Sandhu |
| 2011/0059299 | A1 | 3/2011 | Kim et al. |
| 2011/0147965 | A1 * | 6/2011 | Mistry ...................... A61K 8/11 264/7 |
| 2011/0147984 | A1 * | 6/2011 | Cheng .................... B82Y 10/00 264/220 |
| 2011/0147985 | A1 | 6/2011 | Cheng et al. |
| 2011/0186544 | A1 | 8/2011 | Endou et al. |
| 2011/0229120 | A1 | 9/2011 | Takaki et al. |
| 2011/0272381 | A1 | 11/2011 | Millward et al. |
| 2012/0046415 | A1 | 2/2012 | Millward et al. |
| 2012/0046421 | A1 | 2/2012 | Darling et al. |
| 2012/0077127 | A1 | 3/2012 | Sills et al. |
| 2012/0088192 | A1 | 4/2012 | Trefonas et al. |
| 2013/0189504 | A1 | 7/2013 | Nealey et al. |
| 2014/0061154 | A1 | 3/2014 | Kim et al. |
| 2014/0099583 | A1 | 4/2014 | Holmes et al. |
| 2014/0154630 | A1 | 6/2014 | Schmid et al. |

FOREIGN PATENT DOCUMENTS

| | | |
|---|---|---|
| KR | 20120133272 A | 12/2012 |
| WO | 03016209 A1 | 2/2003 |
| WO | 2008150673 A1 | 12/2008 |
| WO | 2012071330 A1 | 5/2012 |
| WO | 2012084558 A1 | 6/2012 |
| WO | 2012175342 A2 | 12/2012 |
| WO | 2012175343 A1 | 12/2012 |
| WO | 2013010730 A1 | 1/2013 |

OTHER PUBLICATIONS

Taiwan Patent Office, Examination Opinion issued in related TW Application No. 102117111, issued May 21, 2015, 17 pp.
Liu et al., "Integration of Block Copolymer Directed Assembly with 193 Immersion Lithography" American Vacuum Society, J. Vac. Sci. Technol. B 28(6), Nov./Dec. 2010, 5 pp.
Bielawski et al., "Regiospecific One-Pot Synthesis of Diaryliodonium Tetrafluoroborates from Arylboronic Acids and Aryl Iodides," J. Org. Chem. 73:4602-4607, 2008.
Cheng et al., "Developing Directly Photodefinable Substrate Guiding Layers for Block Copolymer Directed Self-Assembly (DSA) Patterning," Proc. of SPIE. 7972:797221(1)-797221(13), 2011.
Cheng et al., "Simple and Versatile Methods to Integrate Directed Self-Assembly with Optical Lithography Using a Polarity-Switched Photoresist," ACS Nano, 4(8):4815-4823, 2010.
Cheng, et al., "EUVL Compatible, LER Solutions using Functional Block Copolymers," Alternative Lithographic Technologies IV, Proc. of SPIE, vol. 8323, 2012, 11 pp.
Cho et al., "Polymer Bound Photobase Generators and Photoacid Generators for Pitch Division Lithography," Proc. of SPIE. 7972:797221(1)-797221(8), 2011.
Cupta, "Photoacid Generators for Catalytic Decomposition of Polycarbonate," Thesis for Master of Science, Georgia Institute of Technology, 2006, 137 pp.
Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).
Maki et al., "Photocleavable Molecule for Laser Desorption Ionization Mass Spectrometry," J. Org. Chem. 72:6427-6433, 2007.
Padmanaban et al., "Application of Photodecomposable Base Concept to 193 nm Resists," Proc. of SPIE. 3999:1136-1146, 2000.
Ross et al., "Si-containing block copolymers for self-assembled nanolithography," J. Vac. Sci. Technol. B. 26 (6):2489-2494, 2008.
Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.
Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.
Ruebner et al., "A cyclodextrin dimer with a photocleavable linker as a possible carrier for the photosensitizer in photodynamic tumor therapy," PNAS. 96(26):14692-14693, 1999.
Skulski, "Organic Iodine(I, III, and V) Chemistry: 10 Years of Development at the Medical University of Warsaw, Poland," Molecules. 5:1331-1371, 2000.
Weissman et al., "Recent advances in ether dealkylation," Tetrahedron. 61:7833-7863, 2005.
Gotrik et al., "Morphology Control in Block Copolymer Films Using Mixed Solvent Vapors," ACS Nano, 6 (9):8052-8059, 2012.
Hammersky et al., "Self-Diffusion of a Polystyrene-Polyisoprene Block Copolymer," Journal of Polymer Science: Part B: Polymer Physics. 34:2899-2909, 1996.

(56) References Cited

OTHER PUBLICATIONS

Jung et al., "Orientation-Controlled Self-Assembled Nanolithography Using a Polystyrene-Polydimethylsiloxane Block Copolymer," Nano Lett. 7(7):2046-2050, 2007.
Jung et al., "A Path to Ultranarrow Patterns Using Self-Assembled Lithography," Nano Lett. 10:1000-1005, 2010.
Postnikov et al., "Study of resolution limits due to intrinsic bias in chemically amplified photoresists," J. Vac. Sci. Technol. B. 17(6):3335-3338, 1999.
Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.
International Searching Authority, International Search Report and Written Opinion issued in corresponding International Application No. PCT/US13/40815, mailed Oct. 21, 2013, 15 pp.
Choi et al., "Square Arrays of Holes and Dots Patterned from a Linear ABC Triblock Terpolymer," ACS Nano, 6(9):8342-8348, 2012.
Foubert et al., "Impact of post-litho LWR smoothing processes on the post-etch patterning result," Proc. of SPIE, 7972:797213(1)-797213(10), 2011.
Tavakkoli K.G. et al., "Templating Three-Dimensional Self-Assembled Structures in Bilayer Block Copolymer Films," Science, 336:1294-1298, 2012.
Cushen et al., "Oligosaccharide/Silicon-Containing Block Copolymers with 5 nm Features for Lithographic Applications" ACS Nano, vol. 6, No. 4, 2012, pp. 3424-3433.
Dean, et al., "Orientation Control of Silicon-containing Block Copolymer Films," Dept. of Chemical Engineering, The University of Texas at Austin, 1 p.
Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.
Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.
Zhao et al., "Self-reorganization of mixed poly(methyl methacrylate)/polystyrene brushes on planar silica substrates in reponse to combined selective solvent treatments and thermal annealing", Polymer 45 (2004) 7979-7988.
International Searching Authority, Search Report and Written Opinion issued in corresponding International Application No. PCT/US2014/016766 dated May 26, 2014, 11 pages.
International Searching Authority, Search Report and Written Opinion issued in corresponding International Application No. PCT/US2014/016776 dated May 30, 2014, 12 pages.
Vayer et al., "Perpendicular orientation of cylindrical domains upon solvent annealing thin films of polystyene-b-polylactide", Thin Solid Films 518 (2010) 3710-3715.
Peng et al., "Development of Nanodomain and Fractal Morphologies in Solvent Annealed Block Copolymer Thin Films", Macromolecular Rapid Communications 2007, 28, 1422-1428.
Yu et al., "Self-assembly of polystyrene--poly(4-vinylpyridine) in deoxycholic acid melt", Polymer, Elsevier Science Publishers B.V, GB, vol. 52, No. 18, Jul. 13, 2011, pp. 3994-4000.
International Searching Authority, Search Report and Written Opinion issued in corresponding International Application No. PCT/US2014/026969 dated Jul. 16, 2014, 15 pages.
International Searching Authority, Search Report and Written Opinion issued in corresponding International Application No. PCT/US2014/027016 dated Jul. 23, 2014, 11 pages.
International Searching Authority, Search Report and Written Opinion issued in corresponding International Application No. PCT/US2014/023926 dated Jul. 25, 2014, 10 pages.
International Searching Authority, Search Report and Written Opinion issued in corresponding International Application No. PCT/US2014/016760 mailed Nov. 6, 2014, 11 pages.
International Searching Authority, Search Report and Written Opinion issued in corresponding International Application No. PCT/US14/61392, mailed Jan. 8, 2015, 9 pages.
Taiwan Intellectual Property Office, Rejection Decision issued in corresponding Taiwan Application No. 103136203, issued Feb. 22, 2016, 5 pp. including English translation.
Taiwan Intellectual Property Office, Notification of Examination Opinion issued in corresponding Taiwan Application No. 103136203 dated Aug. 31, 2015, 11 pp., including English translation.

* cited by examiner

USE OF GRAPHO-EPITAXIAL DIRECTED SELF-ASSEMBLY TO PRECISELY CUT LINES

The present application claims the benefit of and priority to U.S. Provisional Patent Application Nos. 61/893,277 and 61/893,275, each filed on Oct. 20, 2013, the disclosures of which are hereby incorporated by reference herein in their entirety.

FIELD OF THE INVENTION

This invention relates to Directed Self-Assembly (DSA) of block copolymers (BCPs) and using them to make arrays of cut patterns in line structures.

BACKGROUND OF THE INVENTION

One of the limitations on the density scaling of integrated circuit (IC) patterns is the distance between two line ends. Fundamentally, this structure does not follow the same optical scaling as other features in critical circuit patterns (e.g., the critical dimension of a line). Therefore, the industry is always looking for better ways to bring line ends closer together. Starting around the 45 nm node, many IC manufacturers began a double patterning scheme where the lines were created using a first lithographic pattern, and then cut with structures resembling trenches or holes created during a second lithographic step.

In lithography, the creation of regular structures has a variety of applications. From a cost standpoint, the more densely that the structures are packed into a given area, the cheaper it is to fabricate the device. One of the key steps in creating a dense array of a patterned material is to cut an array of densely packed lines.

FIG. 1A depicts an array of densely packed lines 10, which constitute an existing topography 20 on a substrate 18. FIG. 1B then depicts a standard means for cutting the lines 10, namely a trench 12 is patterned in a photoresist 14 applied over the topography 20. FIG. 1C depicts the resulting array 60 of cut lines 10'. As we continue the path of scaling, however, the lithography of the printing of a trench pattern is reaching the limits of what can be achieved optically. This leads to a limit for the end-to-end spacing for abutting lines, and an overall decrease in the packing density of the circuits comprising these lines.

There is thus a need for means to allow smaller cut spaces to be created, and ideally, the means for making the cuts should be less expensive and require less critical lithography.

SUMMARY OF THE INVENTION

A method for forming a patterned topography on a substrate is provided. The substrate is initially provided with a plurality of lines formed atop. An embodiment of the method includes applying a first planarization layer on the plurality of lines, applying a first antireflective layer over the first planarization layer, applying a first layer of radiation-sensitive material over the first antireflective layer, and patterning the first layer of radiation-sensitive material to form a first radiation-sensitive material pattern. That pattern is then transferred into the first planarization layer by etching the first antireflective layer and first planarization layer to partially expose the plurality of lines, the exposed portions of the lines forming first exposed line portions, and any remaining portions of the first radiation-sensitive material pattern and the first antireflective layer are stripped to leave the first exposed line portions surrounded by a first template for directed self-assembly (DSA). Optionally, the first exposed line portions or the first template, or both are treated to alter at least one surface property of the first exposed line portions or the first template. The first template is then filled with a first block copolymer (BCP) to cover the first exposed line portions, and the first BCP is annealed within the first template to drive self-assembly in alignment with the first exposed line portions. The embodiment of the method further includes developing the annealed first BCP to expose a first DSA pattern immediately overlying the first exposed line portions, etching the first exposed line portions using the first DSA pattern as a mask, to form a first set of line cuts in the first exposed line portions, and stripping the first DSA pattern from the substrate.

In a further embodiment, the steps may be repeated on the plurality of lines having the first set of line cuts formed therein to form a second set of line cuts. In another further embodiment, the treating of the first and/or second templates render the respective sidewall surfaces thereof favorable to wetting by one of the minority phase or the majority phase of the first block copolymer (BCP) or the second block copolymer (BCP), respectively. Where the treating renders the sidewall surfaces favorable to wetting by the minority phase of the BCP, the width of the template is between 1.5 and 2.0 times a characteristic dimension $L_o$ of the BCP plus two thicknesses of a wetting layer formed by the minority phase of the BCP on the sidewall of the template. Where the treating renders the sidewall surfaces favorable to wetting by the majority phase of the BCP, the width of the template is between 0.7 and 1.0 times a characteristic dimension $L_o$ of the BCP.

Another embodiment of the method includes aligning and preparing a first DSA pattern immediately overlying the plurality of lines, transferring the first DSA pattern to form a first set of cuts in the plurality of lines, aligning and preparing a second DSA pattern immediately overlying the plurality of lines having the first set of cuts formed therein, and transferring the second DSA pattern to form a second set of cuts in the plurality of lines. The first and second DSA patterns each comprise a block copolymer having a hexagonal close-packed (HCP) morphology and a characteristic dimension $L_o$ that is between 0.9 and 1.1 times the spacing between individual lines of the plurality of lines.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION

Figure 1A:
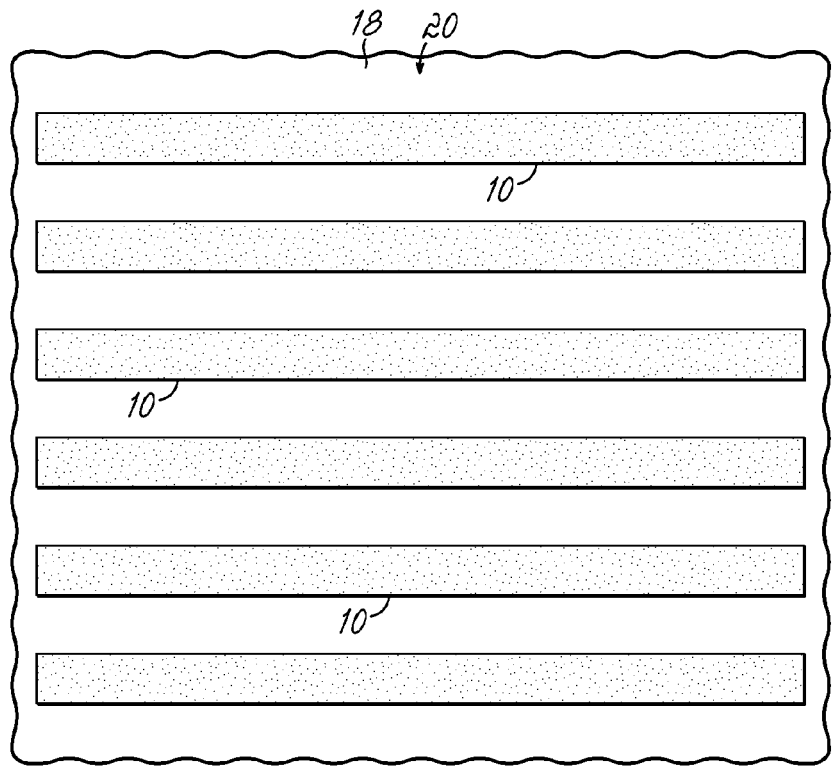
FIGS. 1A-1C schematically depict an array of lines, a patterned resist for cutting the lines, and the resulting array of cut lines, according to the prior art.
Figure 1B:
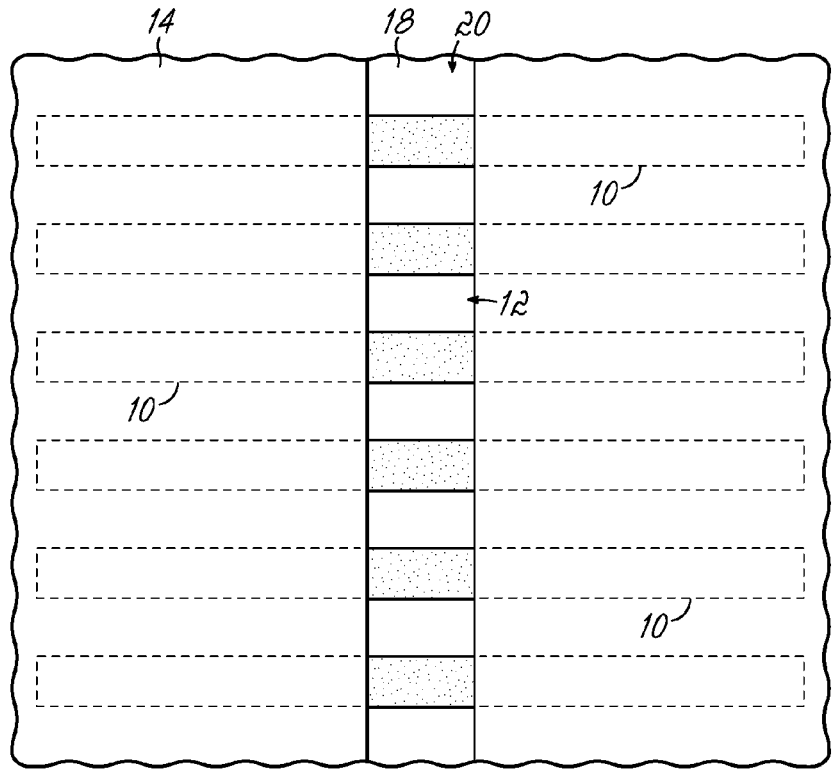
Figure 1C:
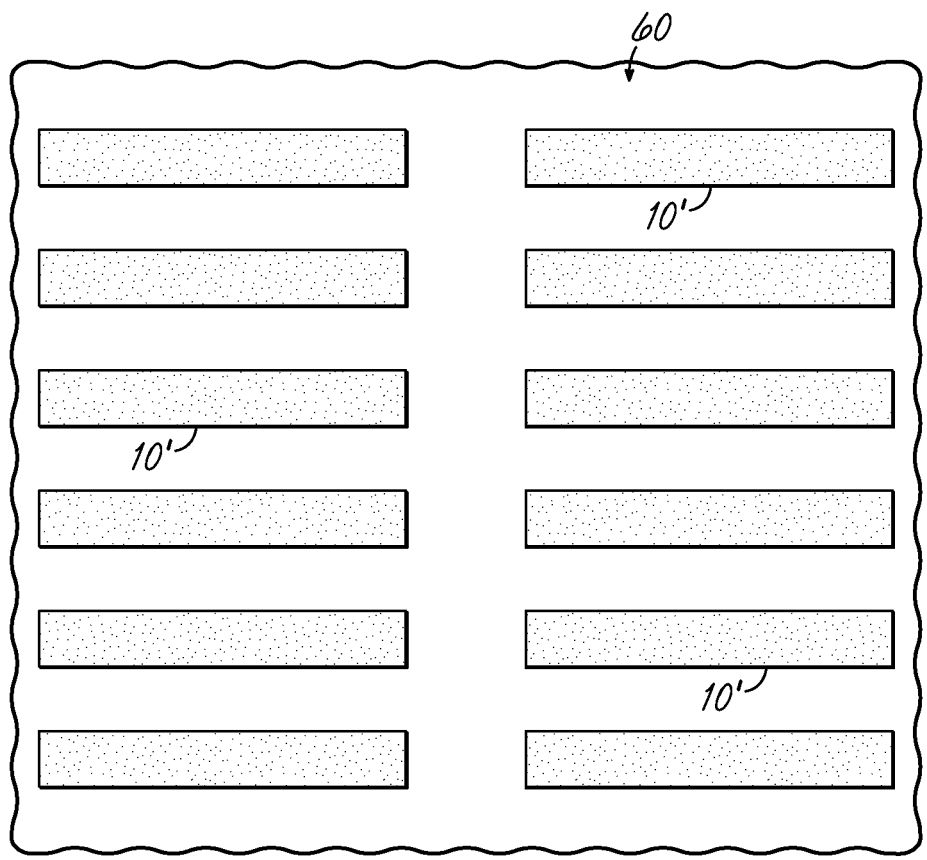

Methods of designing and using grapho-epitaxy and optionally chemo-epitaxy to drive assembly of a block copolymer for patterning line features are disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment.

Various additional operations may be performed and/or described operations may be omitted in additional embodiments.

This invention is directed to the use of block copolymers (BCPs) to perform cuts in lines, and details how to systematically create the tightest packing of features for a given BCP. BCPs can be used in such an application because they fundamentally want to achieve a thermodynamic microstructure of very fine dimensions. Overall, this invention will allow smaller cut spaces to be created, with less expense because less critical lithography will be required.

More specifically, this invention is directed to cutting lines using a grapho-epitaxial and optionally chemo-epitaxial application of directed self-assembly (DSA). The fundamentals of BCPs dictate the required geometries and so determine the tightest packing that can be achieved using a two print, two etch, two DSA process integration. When this system is applied to achieve a tight packing density, it leads to an array of island structures that are at pitches (x and y) dependent on the characteristic length ($L_o$) of the BCP. Looser pitch structures can also be achieved through appropriate choice of the spacing of trenches. Furthermore, the scheme bypasses overlay issues in other approaches by using the topography that will eventually be cut to align and anchor the cylinders formed by the BCPs. In the end, the present invention leverages the fundamentals of BCPs and the topography in the system to place openings in specific locations so that lines may be cut as desired.

As described in FIGS. 2A-2G, scaling of the cuts can be made with the use of DSA of BCPs. A simple approach is to use a grapho-epitaxy structure to form holes that will then allow access to the lines for cutting.

Figure 2A:
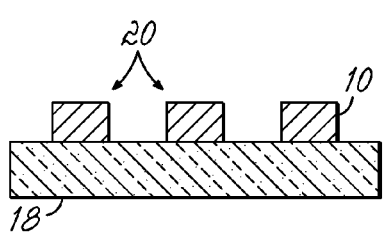
FIGS. 2A-2G schematically depict in cross-sectional view a grapho-epitaxy approach to forming holes to allow access to the lines for cutting, using a single hardmask.
Figure 2B:
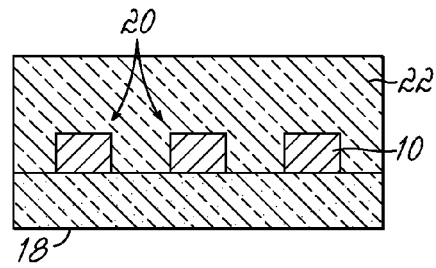
Figure 2C:
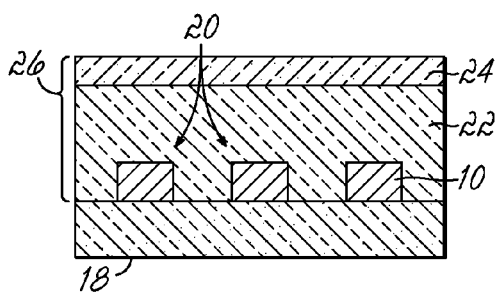
Figure 2D:
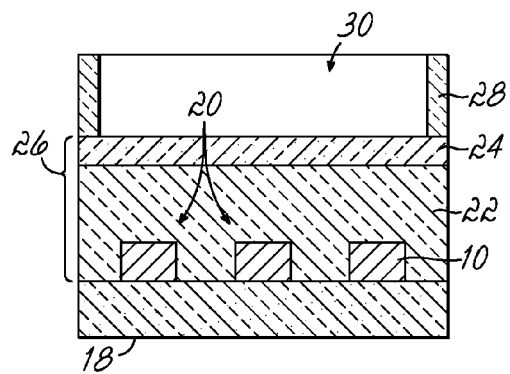
Figure 2E:
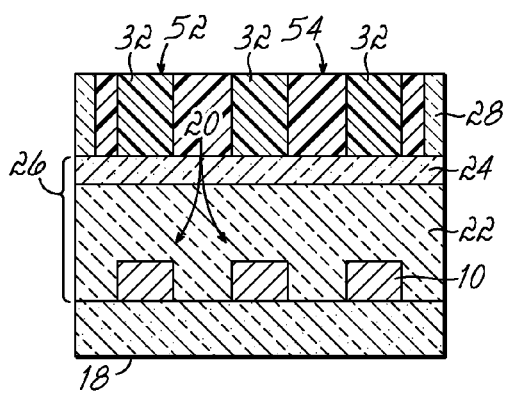
Figure 2F:
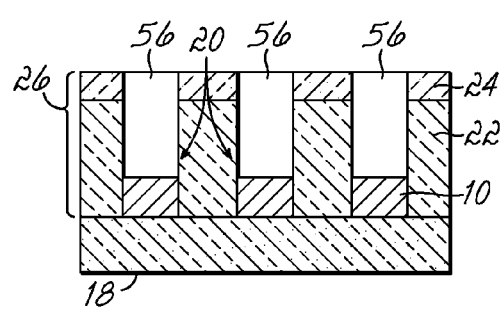
Figure 2G:
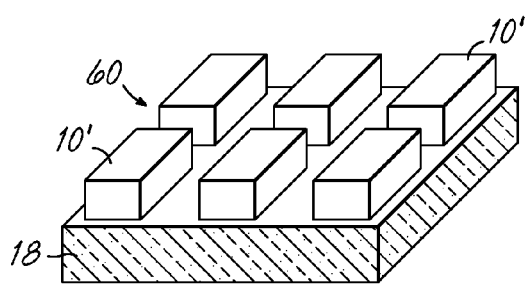

In FIG. 2A, a pre-existing topography 20 is depicted as an array of densely packed lines 10 on a substrate 18. In FIGS. 2B-2C, the topography 20 is then coated with a dual-layer BARC (bottom anti-reflective coating) 26, including a planarization layer 22 (e.g., a spin-on carbon (SOC) layer) in FIG. 2B and an anti-reflective coating (ARC) layer 24 (e.g., a silicon ARC) in FIG. 2C. In an alternative embodiment, a CVD (chemical vapor deposition) stack is used in place of the dual layer BARC 26, such as an alpha carbon coating and a SiON coating in place of the SOC and SiARC coatings. A layer of radiation-sensitive material, e.g., photoresist layer 28, is then applied over the BARC 26 and then patterned to open up a trench, which serves as a grapho-epitaxy template 30, as shown in FIG. 2D. A BCP 50 is then applied to the patterned photoresist layer 28 to fill the template 30 (partially or completely), and then annealed during which the grapho-epitaxy template 30 guides the formation of a cylindrical morphology, as shown in FIG. 2E. More specifically, the anneal causes a first block 52 of the BCP to form a plurality of cylinders 32 aligned over the lines 10 within a matrix of a second block 54 of the BCP. Subsequent development of the BCP 50 to remove the cylindrical morphology forms contact holes 56 within the template 30 overlying the topography 20. These contacts holes 56 are transferred by etching down through the BARC 26 to expose the lines 10 of the underlying topography 20, as shown in FIG. 2F, and the exposed topography 20 is then used to form an array 60 of cut lines 10', as shown in FIG. 2G.

Figure 3A:
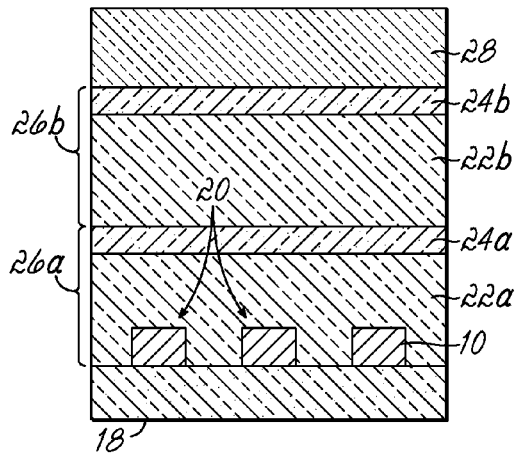
FIGS. 3A-3F schematically depict in cross-sectional view an alternate grapho-epitaxy approach to forming holes to allow access to the lines for cutting, using two hardmasks.
Figure 3B:
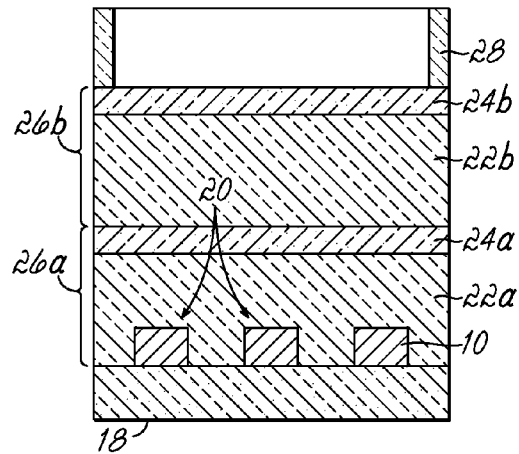
Figure 3C:
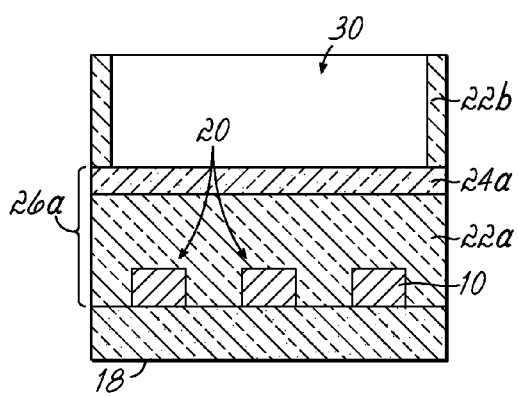
Figure 3D:
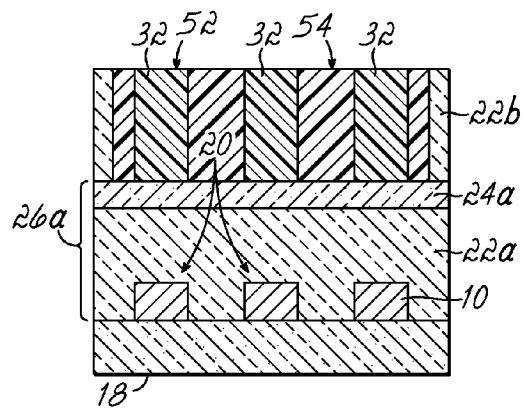
Figure 3E:
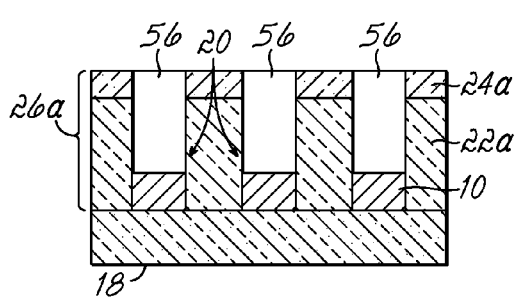
Figure 3F:
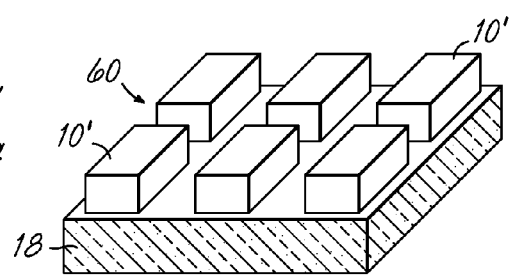

Another approach for cutting lines is depicted in FIGS. 3A-3F, where the photoresist layer 28 is used to pattern another material that would function as a template. For example, a photoresist layer 28 could be used to transfer the pattern into a hardmask and then the hardmask template could be used for the creation of the DSA holes. As shown in FIG. 3A, the stack includes a first planarization layer 22a (e.g., SOC coating) over the array of lines 10, a first ARC layer 24a (e.g., SiARC coating) over the first planarization layer 22a, a second planarization layer 22b (e.g., SOC coating) over the first ARC layer 24a, and a second ARC layer 24b (e.g., SiARC coating) over the second planarization layer 22b, with the photoresist layer 28 applied over the second ARC layer 24b. Thus, there are two hardmask layers 26a and 26b. FIG. 3B depicts patterning the photoresist layer 28 to open up a trench, which is then transferred through the second ARC layer 24b and into the second planarization layer 22b. FIG. 3C depicts the DSA template 30 in the second planarization layer 22b. The BCP 50 is then applied to the patterned second planarization layer 22b to fill the template 30 (partially or completely), and then annealed during which the grapho-epitaxy template 30 guides the formation of a cylindrical morphology, as shown in FIG. 3D. The DSA pattern would thus have to be transferred through both hardmasks 26a, 26b to enable access to the lines 10, as shown in FIG. 3E, so that the array 60 of cut lines 10' can be formed, as shown in FIG. 3F.

Both of these process flows (FIGS. 2A-2G and 3A-3F) are alike in that they separate the DSA from the etch transfer and cutting of the lines. One of the primary reasons for this approach is to avoid the complexity of having the self-assembly process happen on top of the topography itself. Fundamentally, however, there is a significant complication from this kind of approach. Since the BCP is separated from the topography, the only means for aligning the BCP to the underlying topography that will be cut is through the template. The present invention is directed to using the topography to align the BCP directly thereon.

Figure 4:
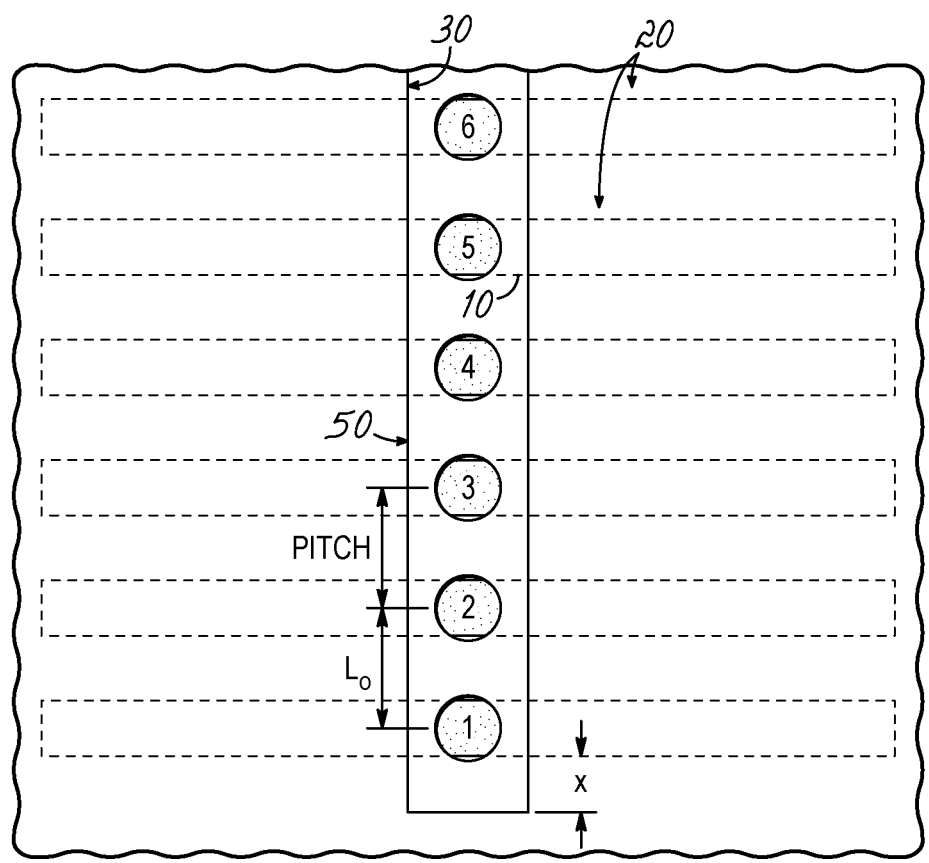
FIG. 4 depicts in top schematic view the termination of the grapho-epitaxial template.

The illustration of FIG. 4 shows the termination of the grapho-epitaxial trench template. The overlay between the trench template 30 and the underlying topography 20 is depicted as x and this overlay dictates where the end of the trench template 30 will be positioned. This placement, in turn, dictates the placement of the first hole (labeled 1). Ideally, the end of the trench template 30 will be placed so that the first hole 1 will be perfectly placed on top of the first line 10. The placement of the subsequent holes, 2, 3, 4, etc., will be dictated by the characteristic length, $L_o$, of the BCP. In the case where the $L_o$ of the BCP perfectly matches the pitch of the lines 10, the subsequent holes will be placed perfectly on top of the lines, as shown. However, even if the pitch is perfectly matched between one BCP and the pitch of the lines, the inherent batch to batch variation in $L_o$ of the BCP will result in catastrophic error in placement of the holes. Suppose that the desired pitch is 32.00 nm, and batch A of the BCP in question has an $L_o$ of 32.00 nm. In this case the system will result in prefect placement of the holes over the lines. Batch B of the BCP is then installed, and it has an $L_o$ of 32.01 nm. After 100 holes are placed, the $100^{th}$ hole will have a placement error of 1 nm. If the spec for the overlay is 5% of the pitch (or 1.6 nm), then after placement of 160 holes, the placement will be out of spec. After 1600 holes, the error would be 16 nm, and the hole would be perfectly misaligned. In memory applications where lines would be cut in arrays that could have thousands of lines, if the self-assembly is agnostic to the underlying pattern, the batch to batch variation of the BCP's $L_o$ will definitely result in failure.

To mitigate this effect, the present invention uses the topography to anchor the placement of the holes. BCPs in general have the ability to stretch a little bit in order to accommodate their surroundings. As long as this stretching is not too dramatic, the BCPs can easily adopt a configuration that is slightly incommensurate with the BCP's $L_o$. Therefore, a method is disclosed where the topography is made in such a way that it will want to attach itself to the topography.

Figure 5A:
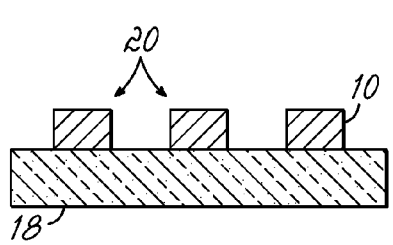
FIGS. 5A-5L depict in schematic cross-sectional view an embodiment of a method for patterning lines using directed self-assembly in accordance with the invention.
Figure 5B:
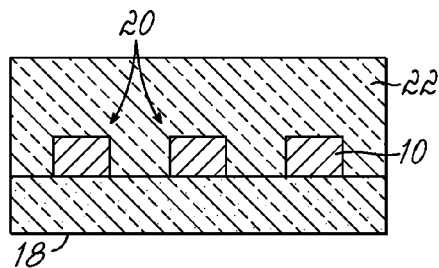
Figure 5C:
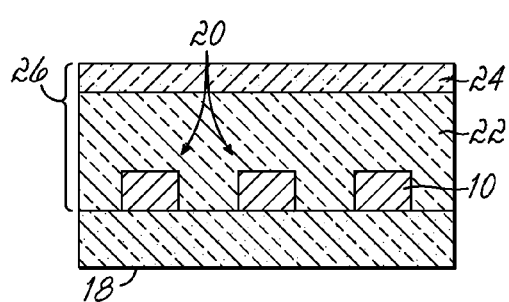

Depicted in schematic cross-sectional view in FIGS. 5A-5L, an array of features, specifically lines 10, has been patterned on a substrate 18, such as a semiconductor wafer, to provide a starting topography 20, as shown in FIG. 5A, and the desire is to cut these lines 10 in specific locations. To that end, in FIG. 5B, a planarization layer 22 is applied to planarize the topography 20. Planarization layer 22 may be, for example, a spin-on carbon layer. The planarization layer 22 will ultimately form the template for the grapho-epitaxy aspect of the invention. Next, as shown in FIG. 5C, an antireflective coating (ARC) layer 24, such as a silicon ARC, is coated on top of the planarization layer 22. It may be understood that the ARC layer 24 may not by itself act as an antireflective coating, but rather, is more generically a second layer that acts in combination with the planarization layer to provide a dual-layer bottom ARC (BARC) 26. Nonetheless, the second layer (layer 24) may be referred to as an ARC layer for the reason that it provides the antireflective properties when combined with the first layer (planarization layer 22). The thicknesses and optical properties of these layers, which form the dual-layer BARC 26, are tailored so that the substrate reflectivity is minimized.

Figure 5D:
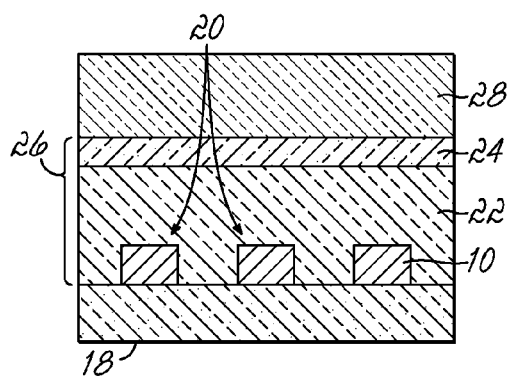
Figure 5E:
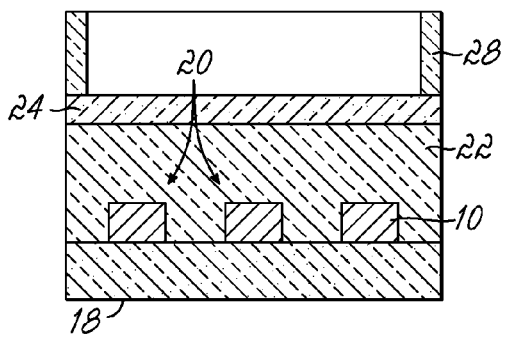
Figure 5F:
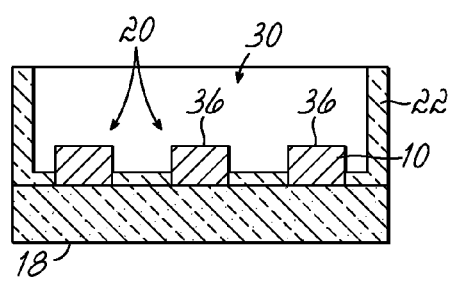

A layer of radiation-sensitive material, e.g., photoresist 28, is coated, as shown in FIG. 5D, and patterned (imaged) on top of this dual-layer BARC 26, as shown in FIG. 5E, and the photoresist image is subsequently transferred into the planarization layer 22 through traditional reactive ion etching (RIE) processing, as shown in FIG. 5F (the photoresist 28 and ARC layer 24 are also removed) thereby forming the template 30 in the planarization layer 22. The depth of etching into the planarization layer 22 may be complete, so as to expose an upper surface of the underlying substrate 18, or partial, so as to leave a portion of the planarization layer 22 at the bottom of the template 30. In either case, surface portions 36 of the lines 10 are exposed, so as to reveal an exposed topography 20 surrounded by the template 30.

Figure 5G:
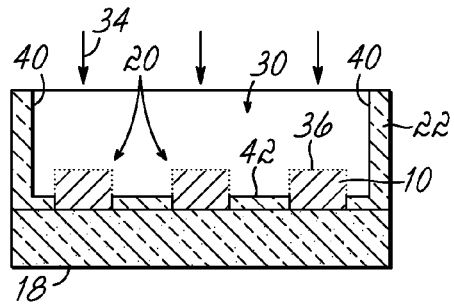

The next step, depicted in FIG. 5G, is an optional surface treatment 34 of the pattern transferred into the planarization layer 22 that will impact the self-assembly of the BCP. As described below in more detail, this treatment is needed in some cases and is not needed in other cases. Further, the surface treatment can effect a change in surface properties of certain surfaces while leaving other surfaces unchanged. For example, as depicted in FIG. 5G, the surface treatment 34 can alter the exposed surface portions 36 of the lines 10, while leaving the sidewalls 40 and bottom surfaces 42 of the template 30 unchanged.

Figure 5H:
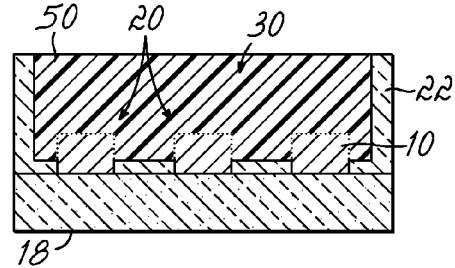
Figure 5I:
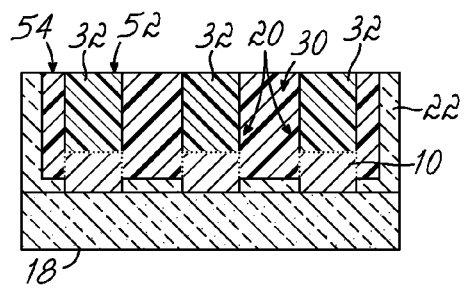
Figure 5J:
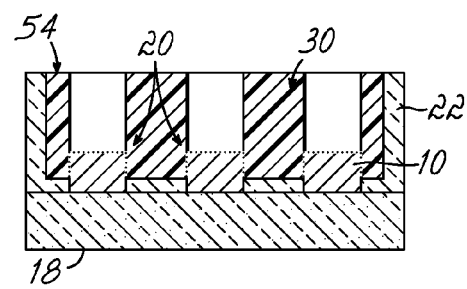
Figure 5K:
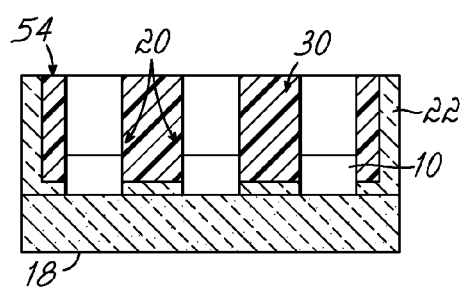
Figure 5L:
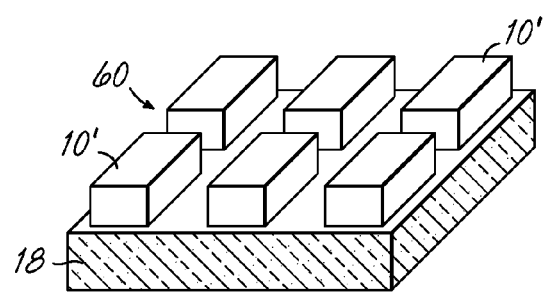

After this optional surface treatment, a BCP 50 is applied to the pattern, as shown in FIG. 5H to fill the template 30 (partially or completely), and then annealed allowing the BCP to form a cylindrical morphology, as shown in FIG. 5I. More specifically, the anneal causes a first block 52 of the BCP to form a plurality of cylinders 32 aligned over the lines 10 within a matrix of a second block 54 of the BCP. Subsequent development of the BCP 50 to remove the cylindrical morphology, i.e., the first block 52 of the BCP 50, as shown in FIG. 5J, gives access to the topography 20 by exposing the DSA pattern immediately overlying the topography 20. There is then access to make the appropriate cuts of the underlying array of lines 10, as shown in FIG. 5K, so etching can be done and selected lines 10 cut, as the circuit design requires, to form a patterned topography. The substrate 18 is then stripped to reveal the patterned topography, i.e., an array 60 of cut lines 10', as shown in FIG. 5L.

Here the DSA template that is created allows access to the topography and so enables the self-assembled holes to graft to the topography without placement error. In co-pending application Ser. No. 14/517,270, entitled "Use of Topography to Direct Assembly of Block Copolymers in Grapho-Epitaxial Applications", incorporated by reference herein in its entirety, this concept is explained in further detail. The present invention builds upon that concept to describe a method for creating the tightest density possible with this grapho-epitaxial and optionally chemo-epitaxial, guided hole approach.

Described above is a process for making guided contact holes within a trench. Multiple passes of this technique will now be combined to create the highest density of cuts possible. Ultimately, the packing of line cuts is defined by the BCP, and by combining these fundamental polymer physics with the topography anchoring concept discussed above, we discover a novel integration for creating these structures.

Figure 6:
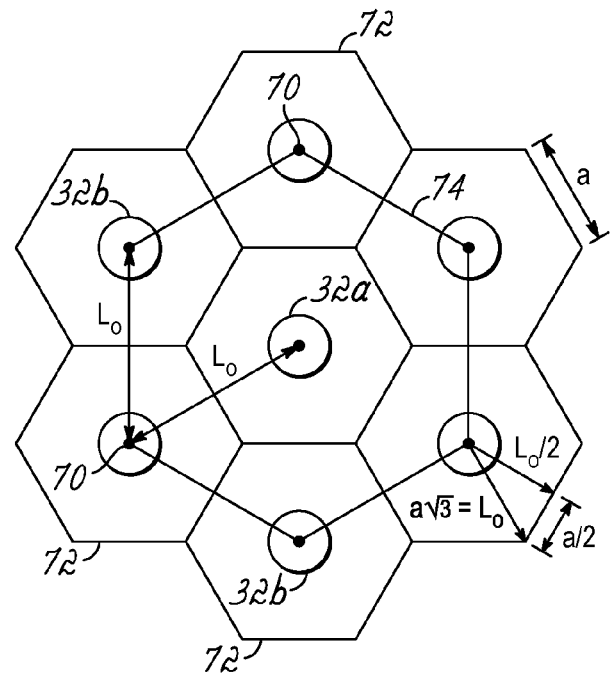
FIG. 6 is a schematic representation of the hexagonal close-packed morphology of the BCP.

To start, we first introduce some of the fundamentals of BCPs that form vertical cylinders. If a cylinder-forming BCP is assembled on top of a neutral surface, it forms a hexagonal close-packed (HCP) structure, i.e. morphology, as shown in FIG. 6. The dots 70 represent the centers of the cylinders 32a, 32b (32a,b) that form within the matrix, and like all HCP structures, there are two kinds of hexagonal unit cells that can be displayed. First, one can construct a hexagon 72 around each of the cylinders 32a,b and these cylinders 32a,b then perfectly fit into a 2-D array. There is a second larger hexagon 74 that can be created around a central cylinder 32a by connecting the centers 70 of the surrounding cylinders 32b. This second hexagonal structure 74 is of particular importance in describing BCPs because the characteristic length $L_o$ of these systems is defined by this center to center distance, and so $L_o$ is both the length of the edge of the larger hexagon 74, and is also the distance from the center cylinder to any of the external vertices. For discussion purposes, the length of the edge of the second smaller unit cell (hexagon 72) will be defined as a. The dimensions a and $L_o$ are related by the properties of a 30-60-90 triangle. Though not derived directly here, the lengths two unit cells are geometrically related are given by the equation:

$$L_o = a\sqrt{3}$$

The geometric configuration dictates the state that the BCP would like to assume in its natural state. This equates to the lowest free-energy configuration of the polymer, such that if the BCP is allowed to retain this configuration as its assembly is guided, the lowest possible pattern defectivity will be attained. It bears noting that $L_o$ as defined for lithographic processing, and for the present invention, differs from $L_o$ as defined for purposes of crystallography. For example, in crystallography, $L_o$ may be defined as the distance between the planes of cylinders that cause scattering of x-rays (i.e., 1.5×a in FIG. 7). In lithography, the characteristic dimension $L_o$ of the BCP is defined as the center to center distance between holes. Thus, the different definitions are related as: $L_o$(lithography)=$2/\sqrt{3} \times L_o$(crystallography)=$1.1547 \times L_o$(crystallography).

Figure 7:
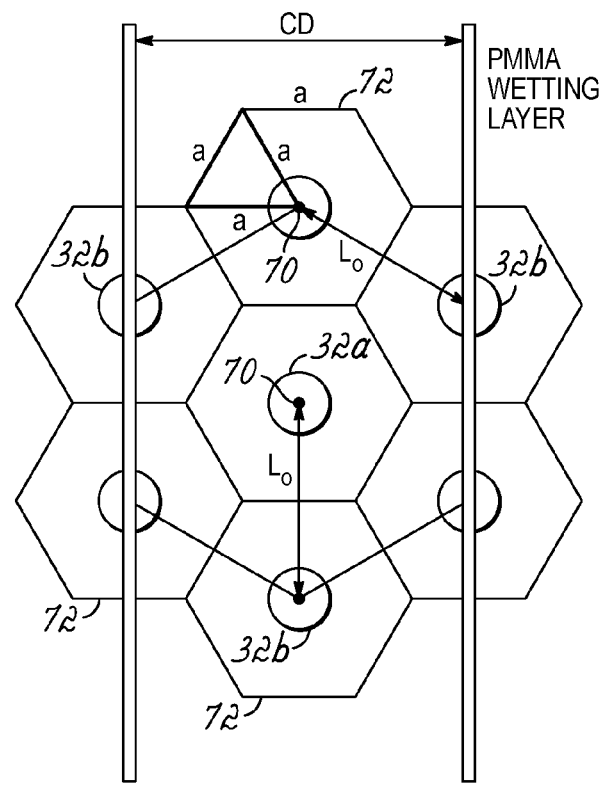
FIG. 7 schematically depicts the dimensional considerations for the morphology of FIG. 6 in the case of preferential wetting by the minority phase of the BCP.
Figure 8:
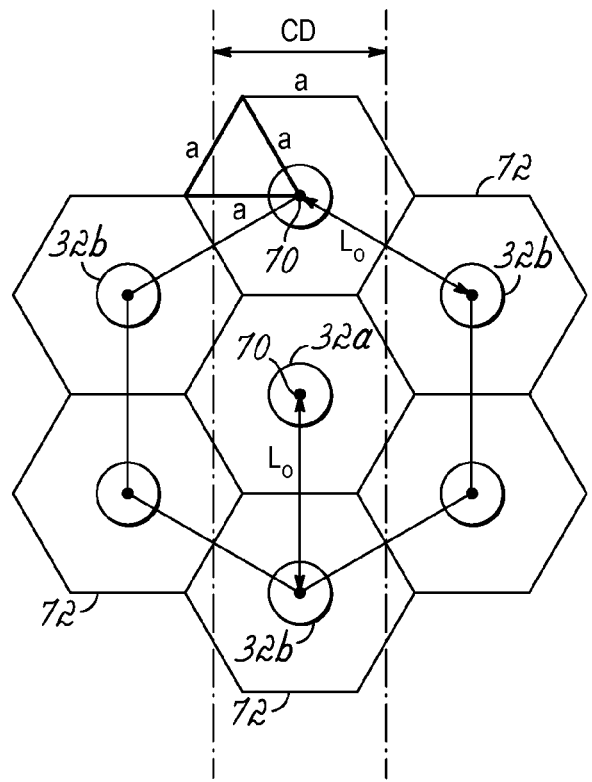
FIG. 8 schematically depicts the dimensional considerations for the morphology of FIG. 6 in the case of preferential wetting by the majority phase of the BCP.

In the context of using a trench template to guide the assembly of the structure, two cases are considered. In each case, a common BCP is used as an example, namely poly (styrene)-b-poly(methyl methacrylate) (PS/PMMA) where PMMA is the minority cylindrical-forming phase. In the first case, the walls of the template will be preferential to the minority phase that will form the BCP cylinder, i.e., preferentially wetting to the PMMA phase. In the second case, the walls of the template will be preferential to the majority phase that will form the matrix, i.e., preferentially wetting to the PS phase. FIG. 7 provides the dimensional considerations for the first case, and FIG. 8 provides the dimensional considerations for the second case.

The critical dimension (CD) of the trench template will dictate how tightly the via arrays are packed. In the first case, the ideal way to have the trench mimic the HCP structure is for the PMMA-wetted walls to be placed to correspond to the center of the adjacent holes in the HCP array. The trench CD in this case is 3a+the distance of 2 PMMA wetting layers. Converting this dimension in terms of $L_o$ would give you the CD of the trench equal to the square root of 3 times $L_o$+the distance of the 2 PMMA wetting layers.

In the second case, the ideal way to have the trench mimic the HCP structure is a zig-zag shaped trench. Since creation of such a structure is highly improbable, the simplest approximation is to draw a trench of uniform width that has the same average width as the zig-zag trench. Again, by geometry, this trench is 3/2 of a, or the square root of 3 divided by two times $L_o$. Note also that there is no additional space required by the wetting layer since the majority phase is wetting the wall of the trench. The trench required by this implementation is significantly narrower than the trench in the first case.

Figure 9:
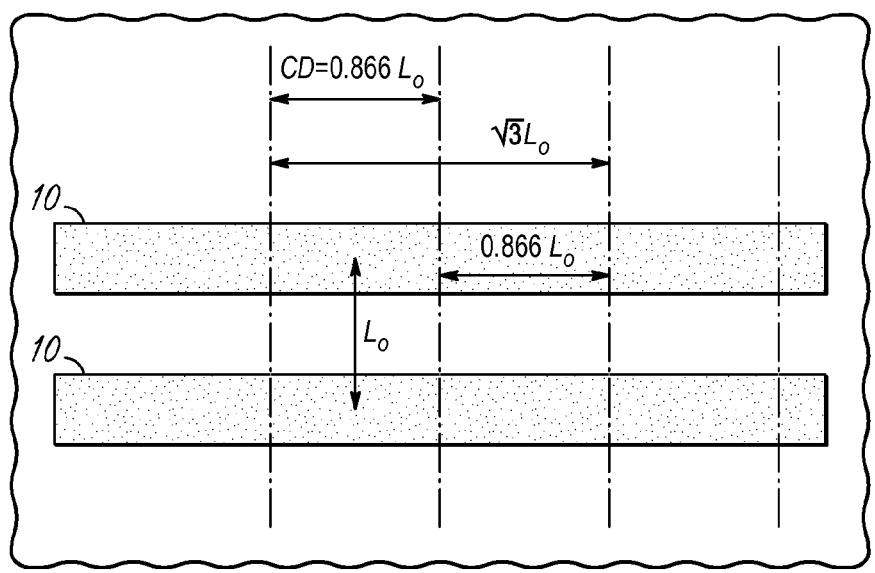
FIG. 9 schematically depicts the layout of the pattern where the $L_o$ of the BCP matches the pitch of the lines in the majority phase wetted case.

To get a dense packing of the holes (and thus the densest density of cuts), an integration is completed that follows a litho/etch/DSA/litho/etch/DSA flow. In terms of the layout of the pattern, as shown schematically in FIG. 9, the $L_o$ of the BCP must match the pitch of the lines 10 that are to be cut, and this factor defines the tightest pitch that can be achieved in the y-direction. The CD of the trench is one half the square root of 3 times the polymer $L_o$, or 0.866 $L_o$. Since the process flow includes two passes, enough space must be left for the second pass (which will also require a trench of dimension equal to 0.866 $L_o$), and so this tight packing will require that much space between the trenches.

Figure 10:
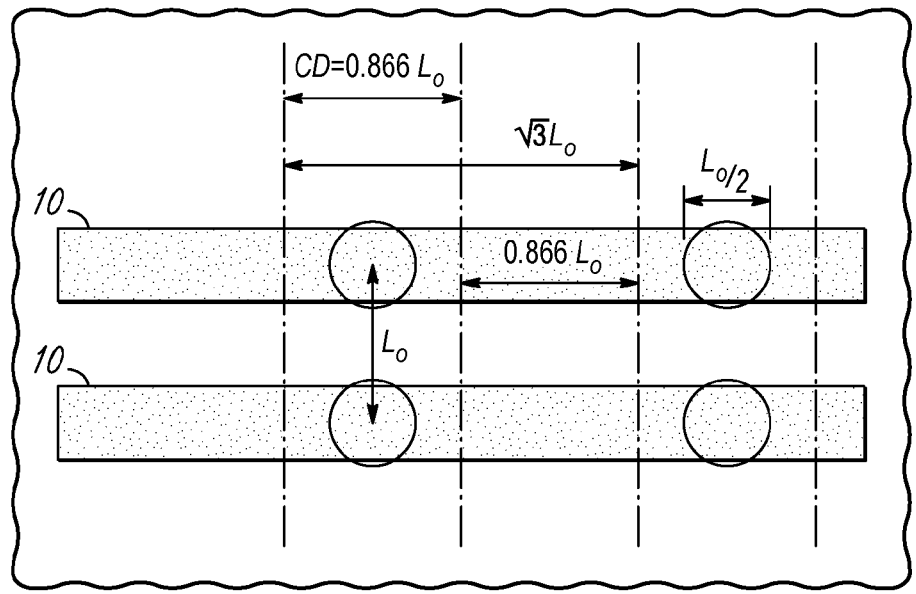
FIG. 10 schematically depicts how the holes would form in the layout of FIG. 9 after a first DSA pass.

FIG. 10 shows how the holes would form. For purposes of example, and not limitation, the CD of the hole is shown to be $L_o/2$. This is not necessarily the case as the CD will depend on the fraction of the BCP that is the minority phase, and there is a volume fraction range over which a BCP will adopt a cylindrical configuration, but for a BCP that is 30% of the minority phase, this is generally found to hold experimentally. If the lines to be cut are equal to the line space, then the holes will have the same dimension as the lines. If this is the case, in order to cut the lines, it may be required to blow out the DSA hole dimensions (for example through an etch process) to make them large enough for line cutting.

Figure 11:
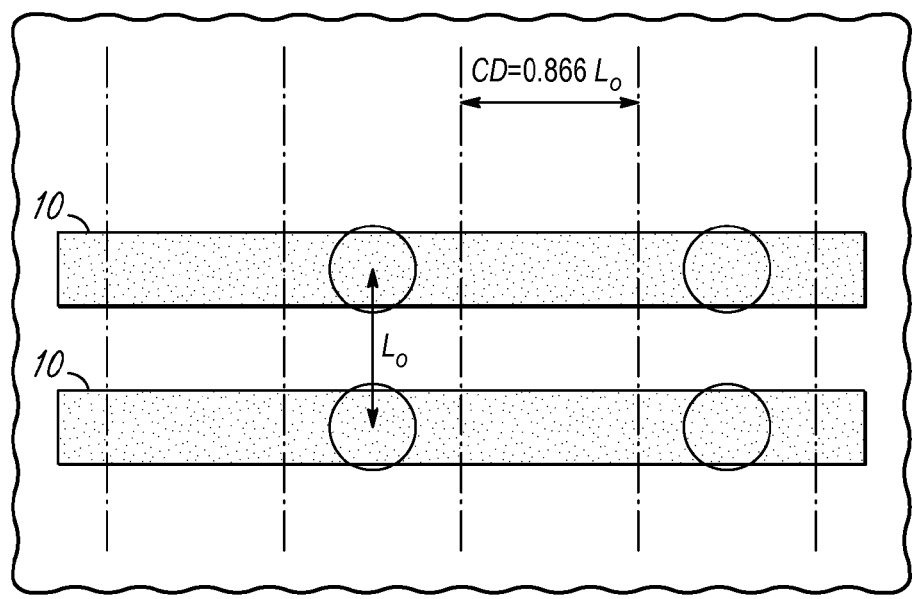
FIG. 11 schematically depicts a second trench lithography with the trenches perfectly placed between the holes created by the first DSA pass.
Figure 12:
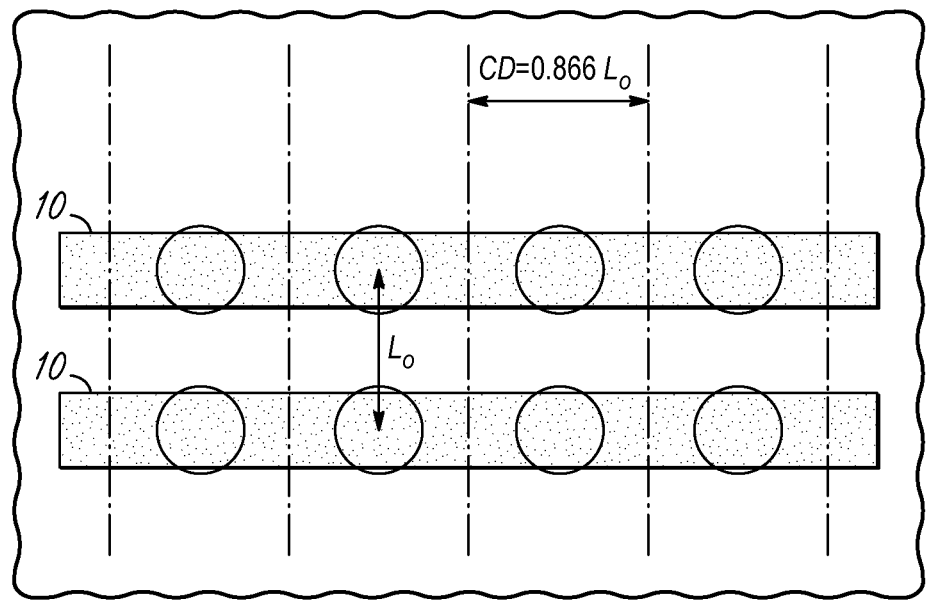
FIG. 12 schematically depicts the result of a second DSA pass.

Following this step, a second pass of the process would be required beginning with a second trench lithography, as shown in FIG. 11. The trenches are perfectly placed between the holes created in the first pass, which holes are protected by photoresist. The second DSA steps then result with the holes located as shown in FIG. 12.

The grid that results from this procedure is $L_o \times 0.866 L_o$ and is an extremely dense packing of cuts. It may further be noted that an array of $L_o \times L_o$ is easily created by increasing the space between the trenches in pass 1 to be $1.134 \times L_o$. In this way, the center to center spacing of the holes in the first pass would be $2 L_o$, which after the second pass would result in holes on a pitch of $L_o$.

Figure 13:
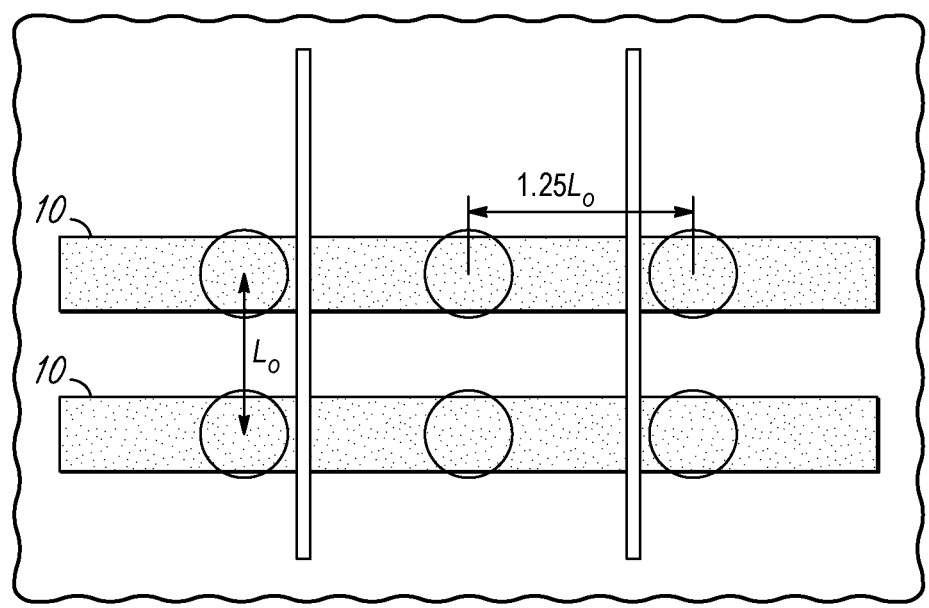
FIG. 13 schematically depicts the result of a two DSA pass process for the minority phase wetted case.

In the case where a minority-phase wetted trench is used instead of majority phase wetted trench, as derived previously, the CD of the trench required to drive optimal assembly is the square root of 3 times $L_o$+the width of two minority phase wetting layers. For representative dimensions, this leads to an approximate value of 2 $L_o$ for the CD of the guiding trench. Completing an analysis similar to that completed above, it is found that the tightest grid that can be created in this case is roughly 1.25 $L_o \times L_o$. This is illustrated in FIG. 13. The trench from the second pass is required to be 2 $L_o$ and it must not uncover either of the holes created in the first pass, and so that defines the spacing between the holes of the first pattern. If the holes are again $L_o/2$ in dimension (in reality, they will be smaller than in the majority-wetting case because a partial volume of the minority phase will wet the wall of the trench, but the $L_o/2$ rule of thumb will still be used), then the pitch between the first holes is 2.5 $L_o$ making the two-pass pitch 1.25 $L_o$.

Figure 14A:
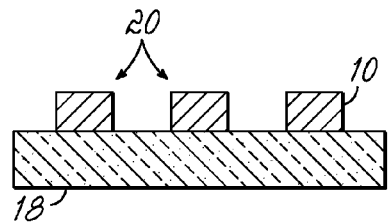
FIGS. 14A-14M depict in schematic cross-sectional view an embodiment of a method for patterning lines using directed self-assembly in accordance with the invention.
Figure 14B:
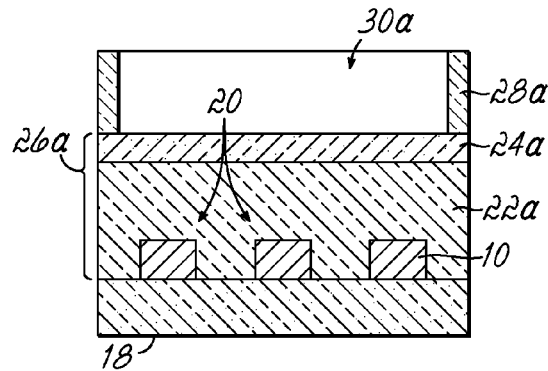
Figure 14C:
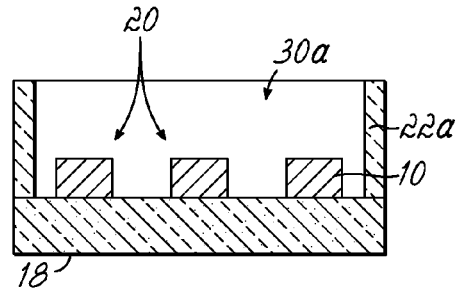

To make the layout schematics above into a real structure on a wafer, the process flow of FIGS. 14A-14M may be followed. In FIG. 14A, a line array or topography 20 is formed with a pitch $L_o$ between lines 10. In FIG. 14B, a first dual-layer BARC 26a is formed, including a first planarization layer 22a and first ARC layer 24a, and a first radiation-sensitive material layer 28a, e.g., photoresist, is applied thereon and patterned with a first plurality of trench templates 30a orthogonal to the lines 10, with each template CD being $\sqrt{3}/2 * L_o$ (=0.866 $L_o$) and the space between templates also being $\sqrt{3}/2 * L_o$ (=0.866 $L_o$). As shown in FIG. 14C, the pattern is then transferred to the first planarization layer 22a.

Figure 14D:
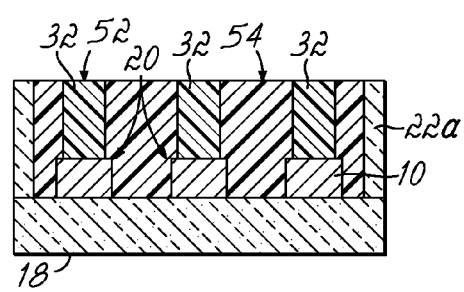

As shown in FIG. 14D, a first DSA pass is then conducted. This includes filling the trench templates 30a with a BCP 50 and then annealing to cause the minority phase of the BCP to form a first plurality of cylinders 32a aligned over the lines 10 within a matrix of the majority phase of the BCP. The cylinders 32a have a CD of $L_o/2$. Optionally, the sidewalls of the trench templates 30a may be brush coated with the majority phase of the BCP, e.g., with a PS—OH polymer, to make the sidewalls attractive to the majority phase, though the brush coating may require a slight adjustment to the dimensions of the initial trench template pattern. Alternatively, the templates 30a may be subjected to other chemical treatments to alter a surface property thereof, for example, to render the sidewalls less attractive to the minority phase of the BCP and/or to render the topography more attractive to the minority phase.

Figure 14E:
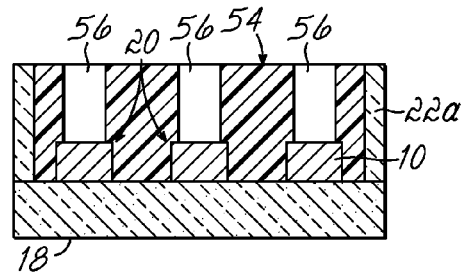
Figure 14F:
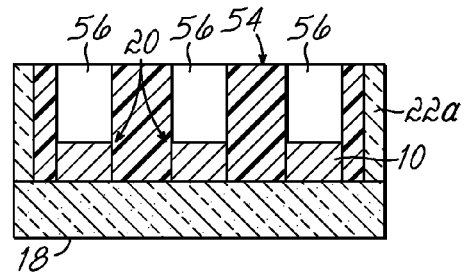
Figure 14G:
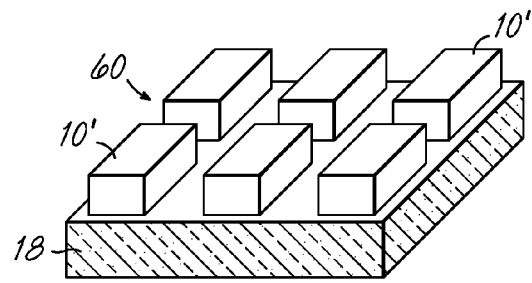

As shown in FIG. 14E, the BCP 50 is then developed to remove the cylindrical morphology thereby exposing a first DSA pattern immediately overlying the topography 20. Optionally, as shown in FIG. 14F, an etching step may be performed to increase the CD of the holes of the DSA pattern to greater than $L_o/2$, up to the CD of the lines 10, or even greater. The first DSA pattern is then transferred into the topography 20 to cut the lines 10. The remaining BCP 50 and first planarization layer 22a are stripped after the lines 10 are cut, leaving the topography 20 as an array 60 of cut lines 10', as shown in FIG. 14G.

Figure 14H:
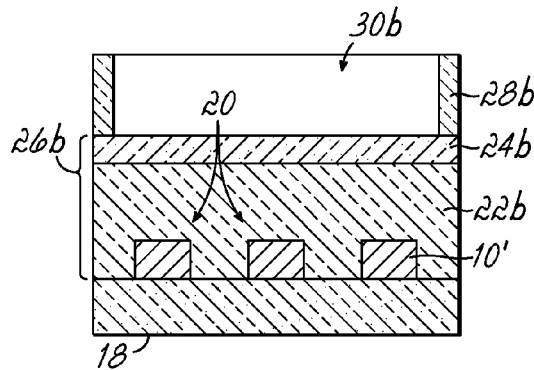
Figure 14I:
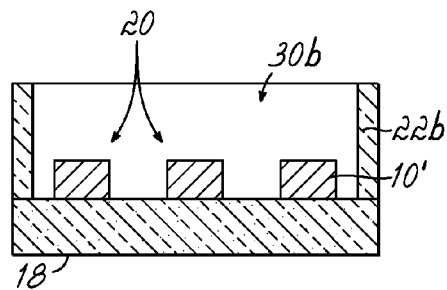

The steps are then repeated for a second DSA pattern. In FIG. 14H, a second dual-layer BARC 26b is formed, including second planarization layer 22b and second ARC layer 24b, and a second radiation-sensitive material layer 28b, e.g., photoresist, is applied thereon and patterned with a second plurality of trench templates 30b orthogonal to the lines 10', with each template CD being $\sqrt{3}/2 * L_o$ (=0.866 $L_o$) and the space between templates also being $\sqrt{3}/2 * L_o$ (=0.866 $L_o$). The trench templates 30b are offset 0.866 Lo from the location where the trench templates 30a were positioned, such that the trench templates 30b are positioned between the cuts in the lines 10'. As shown in FIG. 14I, the pattern is then transferred to the second planarization layer 22b.

Figure 14J:
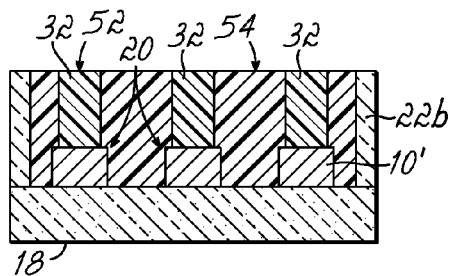

As shown in FIG. 14J, a second DSA pass is then conducted. This includes filling the trench templates 30b with a BCP 50 and then annealing to cause the minority phase of the BCP to form a second plurality of cylinders 32b aligned over the lines 10' within a matrix of the majority phase of the BCP. The cylinders 32b have a CD of $L_o/2$. Optionally, the sidewalls of the trench templates 30 may be brush coated with the majority phase of the BCP, e.g., with a PS—OH polymer, to make the sidewalls attractive to the majority phase, though the brush coating may require a slight adjustment to the dimensions of the initial trench template pattern. Alternatively, the templates 30b may be subjected to other chemical treatments to alter a surface property thereof, for example, to render the sidewalls less attractive to the minority phase of the BCP and/or to render the topography more attractive to the minority phase.

Figure 14K:
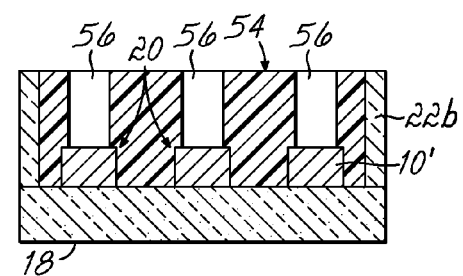
Figure 14L:
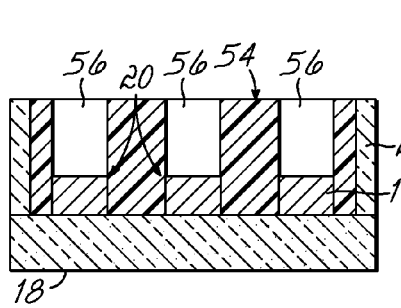
Figure 14M:
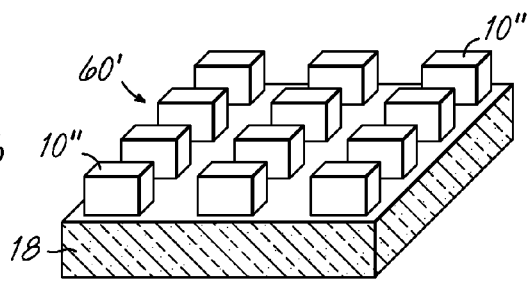

As shown in FIG. 14K, the BCP 50 is then developed to remove the cylindrical morphology thereby exposing a second DSA pattern immediately overlying the topography 20. Optionally, as shown in FIG. 14L, an etching step may be performed to increase the CD of the holes of the DSA pattern to greater than $L_o/2$, up to the CD of the lines 10', or even greater. The second DSA pattern is then transferred into the topography 20 to cut the lines 10' a second time. The remaining BCP 50 and second planarization layer 22b are stripped after the lines 10' are cut, leaving the topography 20 as an array 60' of cut lines 10'', as shown in FIG. 14M.

Further regarding the optional steps of FIGS. 14F and 14L, the etch is designed to make the holes slightly larger than they are with DSA by itself so that they will be larger in size than the lines (assuming the lines are at half of the pitch) If the lines are indeed less than half the pitch, then these steps might not be necessary. Alternatively, if a BCP with a higher volume fraction of the minority phase is used (but still remains in the cylinder-forming part of the phase diagram), then the holes may be larger and may not require these steps.

In order to achieve ultra-high density of cuts, the majority phase should wet the wall of the trench template. In a PS-PMMA BCP, one embodiment for achieving a PS-wetting template sidewall is to coat the trench with a PS—OH brush material. This material will slightly change the CD of the patterned trench, and so the trench would need to be made larger initially (slightly larger than $\sqrt{3}/2 * L_o$ to accommodate the extra mass. The resulting trench after treatment would then be at the critical trench CD.

The present invention contemplates the use of various methods of forming the trench templates, including traditional lithography, sidewall spacer processes, or a combination of traditional lithography with shrink techniques for making smaller trenches, such as growing ALD collars or materials such as RELACS or SAFIER that are known to shrink trenches in photoresist. The shrunken trench could then be transferred into the underlying planarization layer (SOC layer) that would serve as the grapho-epitaxial template. The initial trenches could also be shrunken through the use of etch techniques known to reduce trench CDs.

In the end, the creation of such a tightly packed array of line cuts allows for the creation of a very dense array of patterned islands which can be useful in a variety of different applications.

While specific values have been provided herein, it may be appreciated that the invention is not so limited. For example, when the trench template is favorable to wetting by a minority phase of the BCP, and the BCP has a hexagonal close-packed (HCP) morphology, the width of the template may be between 1.5 and 2.0 times a characteristic dimension $L_o$ of the BCP plus two thicknesses of a wetting layer formed by the minority phase of the BCP on sidewalls of the template. By way of further example, the width of the template may be 1.73 times the characteristic dimension $L_o$ of the BCP plus two thicknesses of the wetting layer. Further, the spacing between the first set of line cuts and the second set of line cuts may be between 1 and 1.5 times the characteristic dimension $L_o$ of the BCP, for example between 1.2 and 1.3 times the $L_o$, and by further example, 1.25 times the $L_o$.

Alternatively, when the trench template is favorable to wetting by a majority phase of the BCP, and the BCP has a hexagonal close-packed (HCP) morphology, the width of the template may be between 0.7 and 1.0 times a characteristic dimension $L_o$ of the BCP. By way of further example, the width of the template may be 0.866 times the characteristic dimension $L_o$ of the BCP. Further, the spacing between the first set of line cuts and the second set of line cuts may be between 0.7 and 1.3 times the characteristic dimension $L_o$ of the BCP, for example between 0.8 and 1 times the $L_o$, and by further example, 0.866 times the $L_o$.

In addition, a BCP may be selected for the present invention having a hexagonal close-packed (HCP) morphology and a characteristic dimension $L_o$ that is between 0.9 and 1.1 times the desired spacing between individual lines of the plurality of lines, and most advantageously, a characteristic dimension $L_o$ that is equal to the desired spacing between individual lines of the plurality of lines.

Figure 15A:
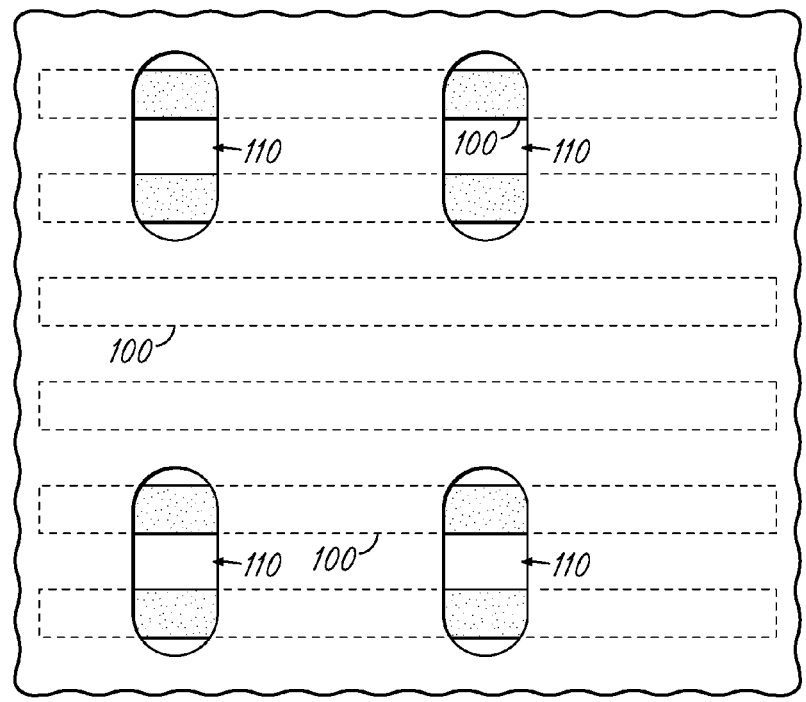
FIGS. 15A-15F depict in top schematic view a litho/etch/DSA/litho/etch/DSA flow for creating a design of line features.
Figure 15B:
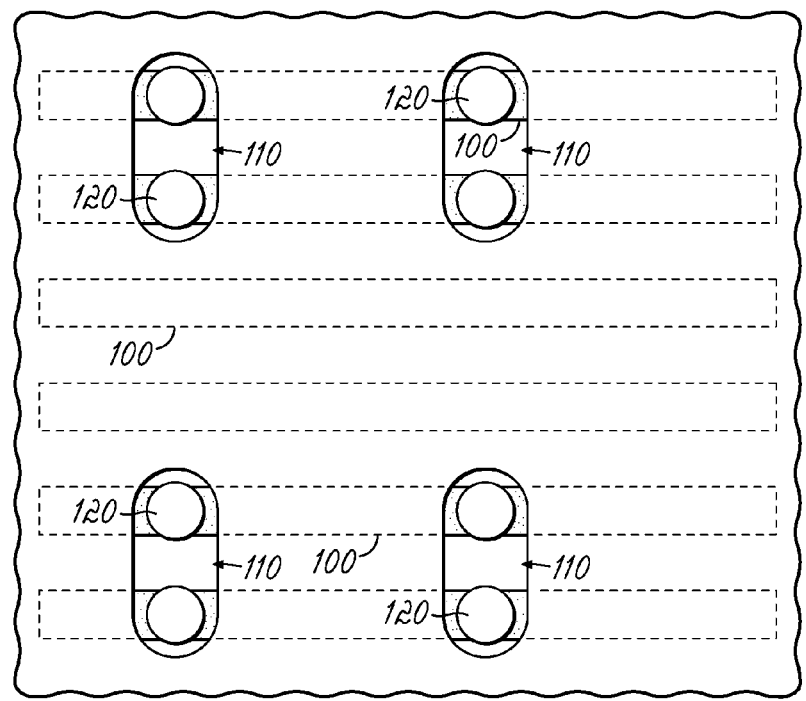
Figure 15C:
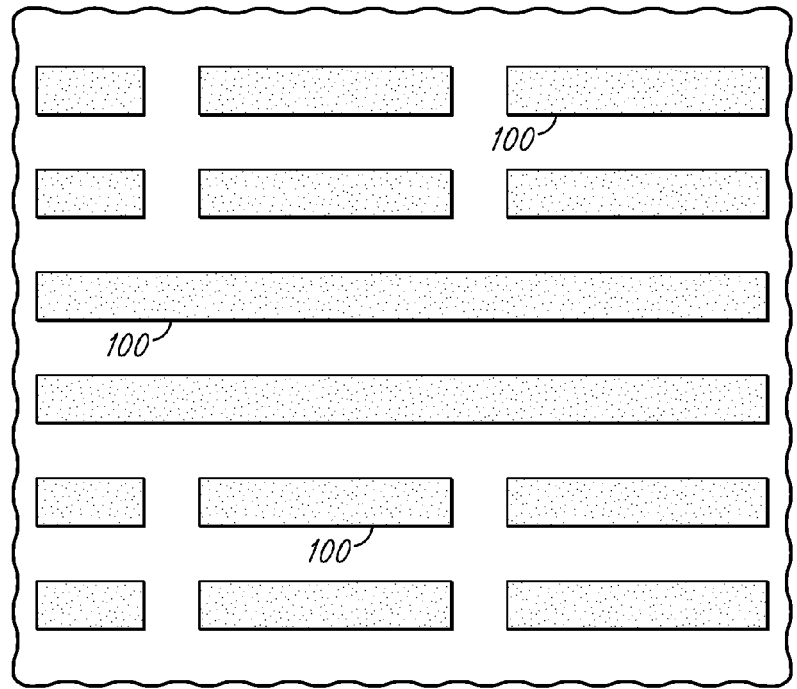
Figure 15D:
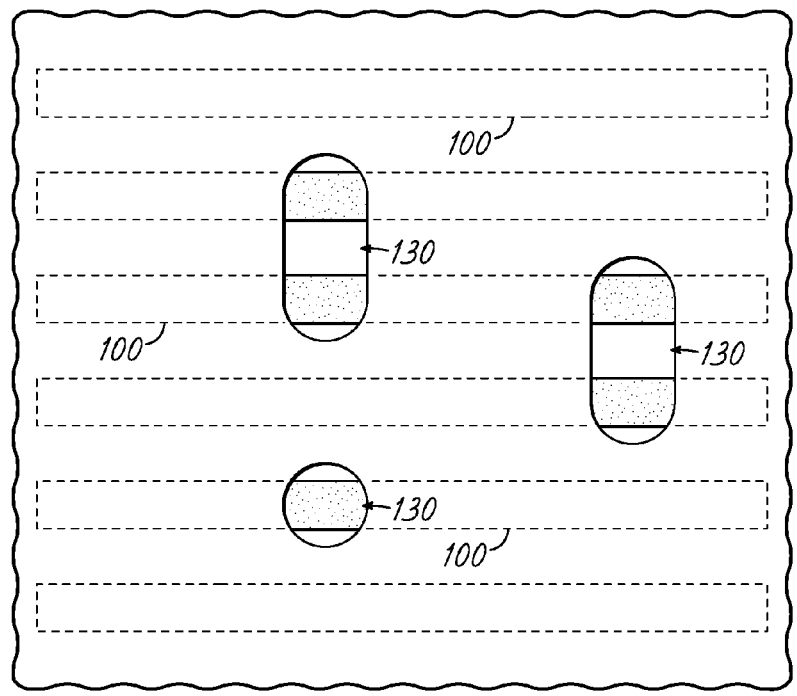
Figure 15E:
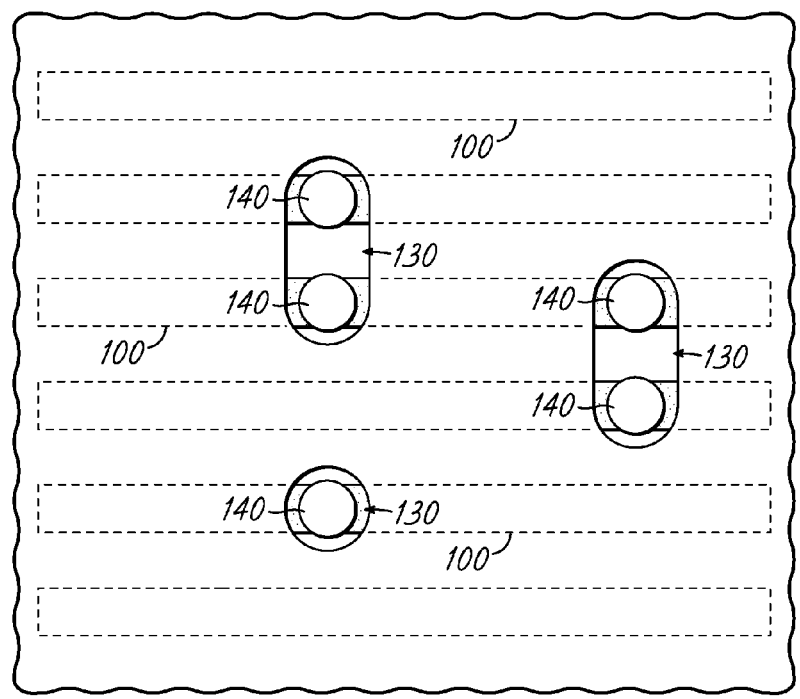
Figure 15F:
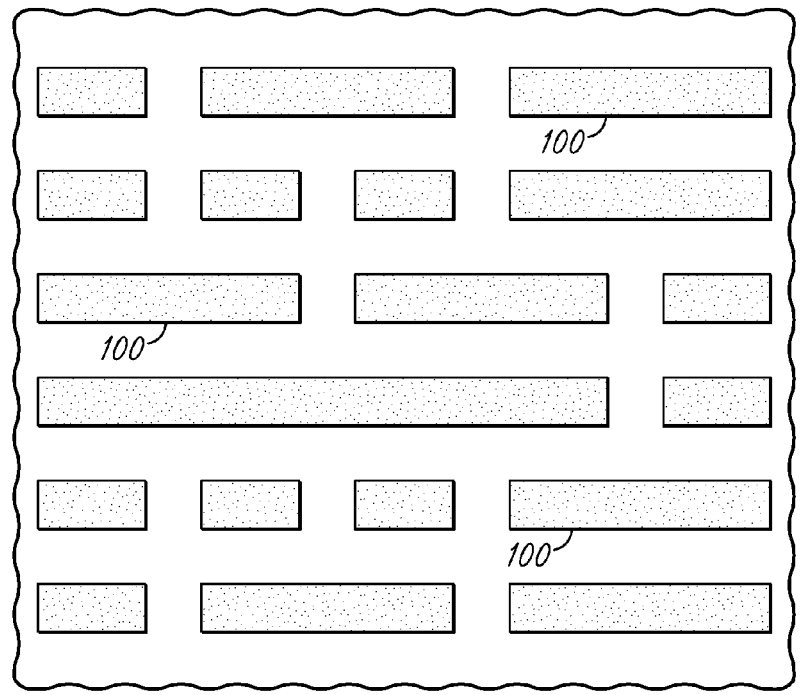

The technique highlighted above can also be modified in a number of ways to make it compatible with logic, memory or other line designs. For example, to make the pattern of FIG. 15F, a litho/etch/DSA/litho/etch/DSA flow can be used to cut the lines 100, as shown in FIGS. 15A-15E. In FIG. 15A, a first set of templates 110 is formed, followed by a first DSA in FIG. 15B to form cylinders 120 in the templates 110. The trench lengths may be shorter since the first DSA pattern will only be used to cut some of the lines. The first DSA pattern is then developed and transferred into the lines 100 to make a portion of the line cuts as shown in FIG. 15C. A second set of templates 130 is then formed, as shown in FIG. 15D, followed by a second DSA in FIG. 15E to form cylinders 140 in the templates 130. The second DSA pattern is then developed and transferred into the lines 100 to make the remaining portion of the line cuts as shown in FIG. 15F.

In the embodiment of FIGS. 14A-14M where the process was designed to create the densest possible array of islands, the nearly infinite trenches were patterned as two populations separated by a minimum distance ($\sqrt{3}*L_o$). That scheme may be viewed in a more simplified way as: (1) Pattern population A of trenches, (2) Transfer Population A, (3) Offset Pattern by desired amount, and pattern population B of trenches, and (4) Transfer Population B. In the line pattern approach of FIG. 15A-15F, instead of having only nearly infinite trenches in Populations A and B, the infinite trenches are decomposed into shorter trenches (or holes) and placed in the same tracks that the infinite trenches occupied. One benefit of the shorter trenches relates to surface interactions. In simulations, it was found that the interaction with the sidewall and the topography is a much stronger influence than with the bottom substrate. Therefore, for these shorter trench structures, footing that occurs due to pattern resolution issues can be mitigated by correctly tailoring the topographic interaction with the photoresist so that the BCP is agnostic to this footing. Likewise, if the tethering topography is correctly created, misalignment in the graphical pattern can also be corrected.

While the present invention has been illustrated by a description of one or more embodiments thereof and while these embodiments have been described in considerable detail, they are not intended to restrict or in any way limit the scope of the appended claims to such detail. Additional alternatives, advantages and/or modifications will readily appear to those skilled in the art. For example, it may be possible to control the template topography and surfaces so that the cylinders land between the lines instead of on top of them. The invention in its broader aspects is therefore not limited to the specific details, representative apparatus and method, and illustrative examples shown and described. Accordingly, departures may be made from such details without departing from the scope of the general inventive concept.

What is claimed is:

1. A method for forming a patterned topography on a substrate, comprising:
   providing a substrate with a plurality of lines formed atop;
   applying a first planarization layer on the plurality of lines;
   applying a first antireflective layer over the first planarization layer;
   applying a first layer of radiation-sensitive material over the first antireflective layer;
   patterning the first layer of radiation-sensitive material to form a first radiation-sensitive material pattern;
   transferring the first radiation-sensitive material pattern into the first planarization layer by etching the first antireflective layer and first planarization layer to partially expose the plurality of lines, the exposed portions of the plurality of lines forming first exposed line portions;
   stripping any remaining portions of the first radiation-sensitive material pattern and the first antireflective layer to leave the first exposed line portions surrounded by a first template for directed self-assembly (DSA);
   optionally treating the first exposed line portions or the first template, or both to alter at least one surface property of the first exposed line portions or the first template;
   filling the first template with a first block copolymer (BCP) to cover the first exposed line portions;
   annealing the first block copolymer (BCP) within the first template to drive self-assembly in alignment with the first exposed line portions;
   developing the annealed first block copolymer (BCP) to expose a first directed self-assembly (DSA) pattern immediately overlying the first exposed line portions;
   etching the first exposed line portions using the first directed self-assembly (DSA) pattern as a mask, to form a first set of line cuts in the first exposed line portions; and
   stripping the first directed self-assembly (DSA) pattern from the substrate.

2. The method of claim 1, wherein the first template is preferential to wetting by a minority phase of the first block copolymer (BCP), the first block copolymer (BCP) having a hexagonal close-packed (HCP) morphology.

3. The method of claim 2, wherein the width of the first template is between 1.5 and 2.0 times a characteristic dimension $L_o$ of the first block copolymer (BCP) plus two thicknesses of a wetting layer formed by the minority phase of the first block copolymer (BCP) on sidewalls of the first template.

4. The method of claim 1, wherein the first template is preferential to wetting by a majority phase of the first block copolymer (BCP), the first block copolymer (BCP) having a hexagonal close-packed (HCP) morphology.

5. The method of claim 4, wherein the width of the first template is between 0.7 and 1.0 times a characteristic dimension $L_o$ of the first block copolymer (BCP).

6. The method of claim 1, further comprising:
   applying a second planarization layer on the plurality of lines having the first set of line cuts formed therein;
   applying a second antireflective layer over the second planarization layer;

applying a second layer of radiation-sensitive material over the second antireflective layer;

patterning the second layer of radiation-sensitive material to form a second radiation-sensitive material pattern;

transferring the second radiation-sensitive material pattern into the second planarization layer by etching the second antireflective layer and second planarization layer to partially expose the plurality of lines, the exposed portions of the plurality of lines forming second exposed line portions;

stripping any remaining portions of the second radiation-sensitive material pattern and the second antireflective layer to leave the second exposed line portions surrounded by a second template for directed self-assembly (DSA);

optionally treating the second exposed line portions or the second template, or both to alter at least one surface property of the second exposed line portions or the second template;

filling the second template with a second block copolymer (BCP) to cover the second exposed line portions;

annealing the second block copolymer (BCP) within the second template to drive self-assembly in alignment with the second exposed line portions;

developing the annealed second block copolymer (BCP) to expose a second directed self-assembly (DSA) pattern immediately overlying the second exposed line portions;

etching the second exposed line portions using the second directed self-assembly (DSA) pattern as a mask, to form a second set of line cuts in the second exposed line portions;

stripping the second directed self-assembly (DSA) pattern from the substrate.

7. The method of claim 6, wherein the second template is preferential to wetting by a minority phase of the second block copolymer (BCP), the second block copolymer (BCP) having a hexagonal close-packed (HCP) morphology.

8. The method of claim 7, wherein the width of the second template is between 1.5 and 2.0 times a characteristic dimension $L_o$ of the second block copolymer (BCP) plus two thicknesses of a wetting layer formed by the minority phase of the second block copolymer (BCP) on sidewalls of the second template.

9. The method of claim 6, wherein the second template is preferential to wetting by a majority phase of the second block copolymer (BCP), the second block copolymer (BCP) having a hexagonal close-packed (HCP) morphology.

10. The method of claim 9, wherein the width of the second template is between 0.7 and 1.0 times a characteristic dimension $L_o$ of the second block copolymer (BCP).

11. The method of claim 6, wherein the first template is preferential to wetting by a minority phase of the first block copolymer (BCP), the second template is favorable to wetting by a minority phase of the second block copolymer (BCP), the first and second block copolymers (BCPs) having a hexagonal close-packed (HCP) morphology, and wherein the spacing between the first set of line cuts and the second set of line cuts is between 1 and 1.5 times the characteristic dimension $L_o$ of the first block copolymer (BCP) or second block copolymer (BCP).

12. The method of claim 11, wherein the spacing between the first set of line cuts and the second set of line cuts is between 1.2 and 1.3 times the characteristic dimension $L_o$ of the first block copolymer (BCP) or second block copolymer (BCP).

13. The method of claim 6, wherein the first template is preferential to wetting by a majority phase of the first block copolymer (BCP), the second template is preferential to wetting by a majority phase of the second block copolymer (BCP), the first and second block copolymers (BCPs) having a hexagonal close-packed (HCP) morphology, and wherein the spacing between the first set of line cuts and the second set of line cuts is between 0.7 and 1.3 times the characteristic dimension $L_o$ of the first block copolymer (BCP) or second block copolymer (BCP).

14. The method of claim 13, wherein the spacing between the first set of line cuts and the second set of line cuts is between 0.8 and 1 times the characteristic dimension $L_o$ of the first block copolymer (BCP) or second block copolymer (BCP).

15. A method for forming a patterned topography on a substrate, comprising:

providing a substrate with an exposed plurality of lines formed atop;

aligning and preparing a first directed self-assembly pattern (DSA) pattern immediately overlying the plurality of lines;

transferring the first directed self-assembly pattern (DSA) pattern to form a first set of cuts in the plurality of lines;

aligning and preparing a second directed self-assembly pattern (DSA) pattern immediately overlying the plurality of lines having the first set of cuts formed therein; and transferring the second directed self-assembly pattern (DSA) pattern to form a second set of cuts in the plurality of lines, wherein the first and second directed self-assembly (DSA) patterns each comprise a block copolymer having a hexagonal close-packed (HCP) morphology and a characteristic dimension $L_o$ that is between 0.9 and 1.1 times the spacing between individual lines of the plurality of lines.

16. The method of claim 15, wherein the first and second directed self-assembly (DSA) patterns each comprise a block copolymer having a characteristic dimension $L_o$ that is approximately equal the spacing between individual lines of the plurality of lines.

17. The method of claim 15, wherein the spacing between the first set of cuts and the second set of cuts is less than the spacing between individual lines of the plurality of lines.

18. The method of claim 15, wherein the spacing between the first set of cuts and the second set of cuts is between 0.7 and 1.3 times the spacing between individual lines of the plurality of lines.

19. The method of claim 15, wherein the spacing between the first set of cuts and the second set of cuts is between 0.8 and 0.9 times the spacing between individual lines of the plurality of lines.

20. A method for forming a patterned topography on a substrate, comprising:

(a) providing a substrate with a plurality of lines formed atop;

(b) applying a planarization layer on the plurality of lines;

(c) applying an antireflective layer over the planarization layer;

(d) applying a layer of radiation-sensitive material over the antireflective layer;

(e) patterning the layer of radiation-sensitive material to form a radiation-sensitive material pattern;

(f) transferring the radiation-sensitive material pattern into the planarization layer by etching the antireflective layer and planarization layer to partially expose the plurality of lines, the exposed portions of the plurality of lines forming exposed line portions;

(g) stripping any remaining portions of the radiation-sensitive material pattern and the antireflective layer to leave the exposed line portions surrounded by a template for directed self-assembly (DSA);

(h) surface treating the template;

(i) filling the treated template with a block copolymer (BCP) to cover the exposed line portions, the block copolymer (BCP) having a hexagonal close-packed (HCP) morphology and a characteristic dimension $L_o$ that is between 0.9 and 1.1 times the spacing between individual lines of the plurality of lines;

(j) annealing the block copolymer (BCP) within the template to drive self-assembly in alignment with the exposed line portions;

(k) developing the annealed block copolymer (BCP) to expose a directed self-assembly (DSA) pattern immediately overlying the exposed line portions;

(l) etching the exposed line portions using the directed self-assembly (DSA) pattern as a mask, to form a first set of line cuts in the exposed line portions;

(m) stripping the directed self-assembly (DSA) pattern from the substrate;

(n) repeating steps (b)-(m) a second time to form a second set of line cuts offset from the first set of line cuts formed by the first performance of steps (b)-(m), wherein the spacing between the first set of line cuts and the second set of line cuts is between 0.7 and 1.3 times the spacing between the individual lines of the plurality of lines, and wherein the surface treating of the template renders the sidewall surface thereof preferential to wetting by one of the minority phase or the majority phase of the block copolymer (BCP).

21. The method of claim 20, wherein the surface treating renders the sidewall surface preferential to wetting by the minority phase of the block copolymer (BCP), and wherein the width of the template is between 1.5 and 2.0 times a characteristic dimension $L_o$ of the block copolymer (BCP) plus two thicknesses of a wetting layer formed by the minority phase of the block copolymer (BCP) on the sidewall of the template.

22. The method of claim 20, wherein the surface treating renders the sidewall surface preferential to wetting by the majority phase of the block copolymer (BCP), and wherein the width of the template is between 0.7 and 1.0 times a characteristic dimension $L_o$ of the block copolymer (BCP).

* * * * *